(12) United States Patent
Kunitake et al.

(10) Patent No.: US 12,206,370 B2
(45) Date of Patent: Jan. 21, 2025

(54) SEMICONDUCTOR DEVICE INCLUDING HIGH FREQUENCY AMPLIFIER CIRCUIT, ELECTRONIC COMPONENT, AND ELECTRONIC DEVICE

(71) Applicant: Semiconductor Energy Laboratory Co., Ltd., Atsugi (JP)

(72) Inventors: Hitoshi Kunitake, Isehara (JP); Takayuki Ikeda, Atsugi (JP); Kiyoshi Kato, Atsugi (JP); Yuichi Yanagisawa, Atsugi (JP); Shota Mizukami, Ebetsu (JP); Kazuki Tsuda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 518 days.

(21) Appl. No.: 17/619,669

(22) PCT Filed: Jun. 16, 2020

(86) PCT No.: PCT/IB2020/055591
§ 371 (c)(1),
(2) Date: Dec. 16, 2021

(87) PCT Pub. No.: WO2020/261039
PCT Pub. Date: Dec. 30, 2020

(65) Prior Publication Data
US 2022/0345095 A1 Oct. 27, 2022

(30) Foreign Application Priority Data

Jun. 28, 2019 (JP) ................................ 2019-121564
Oct. 4, 2019 (JP) ................................ 2019-183926
(Continued)

(51) Int. Cl.
*H03G 3/30* (2006.01)
*H01L 29/786* (2006.01)
(Continued)

(52) U.S. Cl.
CPC .......... *H03F 3/195* (2013.01); *H01L 29/7869* (2013.01); *H03F 1/0233* (2013.01); *H03F 2200/102* (2013.01)

(58) Field of Classification Search
CPC ........................................................ H03G 3/30
(Continued)

(56) References Cited

U.S. PATENT DOCUMENTS 6,166,598 A    12/2000   Schlueter
6,421,533 B1 *    7/2002   Greverie .............. H03G 3/3047
                                                                               375/296
(Continued)

FOREIGN PATENT DOCUMENTS

CN        001282151 A     1/2001
CN        101019309 A     8/2007
(Continued)

OTHER PUBLICATIONS

International Search Report (Application No. PCT/IB2020/055591) Dated Sep. 24, 2020.
(Continued)

*Primary Examiner* — Henry Choe
(74) *Attorney, Agent, or Firm* — Eric J. Robinson; Robinson Intellectual Property Law Office, P.C.

(57) ABSTRACT

A semiconductor device is provided in which power consumption is reduced and an increase in circuit area is inhibited. The semiconductor device includes a high frequency amplifier circuit, an envelope detection circuit, and a power supply circuit. The power supply circuit has a function of supplying a power supply potential to the high frequency amplifier circuit, an output of the high frequency amplifier circuit is connected to the envelope detection circuit, and an output of the envelope detection circuit is connected to the power supply circuit. The power supply
(Continued)

circuit can reduce the power consumption by changing the power supply potential in accordance with the output of the high frequency amplifier circuit. The use of an OS transistor in the envelope detection circuit can inhibit an increase in circuit area.

7 Claims, 26 Drawing Sheets

(30) Foreign Application Priority Data

Apr. 27, 2020 (JP) .................................. 2020-078408
May 7, 2020 (JP) .................................. 2020-081849

(51) Int. Cl.
*H03F 1/02* (2006.01)
*H03F 3/195* (2006.01)

(58) Field of Classification Search
USPC .................................................. 330/279, 278
See application file for complete search history.

(56) References Cited

U.S. PATENT DOCUMENTS

| | | | | |
|---|---|---|---|---|
| 8,461,928 | B2 * | 6/2013 | Yahav | H03G 3/007 |
| | | | | 330/297 |
| 9,391,476 | B2 | 7/2016 | Kamata et al. | |
| 9,673,335 | B2 | 6/2017 | Kamata | |
| 10,490,553 | B2 | 11/2019 | Yamazaki | |
| 2011/0186837 | A1 | 8/2011 | Takahashi et al. | |
| 2014/0085008 | A1 * | 3/2014 | Cohen | B82Y 40/00 |
| | | | | 330/297 |
| 2020/0243506 | A1 | 7/2020 | Sasaki | |

FOREIGN PATENT DOCUMENTS

| | | |
|---|---|---|
| DE | 10035065 | 2/2001 |
| EP | 2490330 A | 8/2012 |
| GB | 2352896 | 2/2001 |
| JP | 59-174009 A | 10/1984 |
| JP | 03-258121 A | 11/1991 |
| JP | 05-315873 A | 11/1993 |
| JP | 05-347524 A | 12/1993 |
| JP | 2001-068941 A | 3/2001 |
| JP | 2008-508786 | 3/2008 |
| JP | 2011-176294 A | 9/2011 |
| JP | 2017-069577 A | 4/2017 |
| JP | 2019-079860 A | 5/2019 |
| KR | 2001-0015388 A | 2/2001 |
| KR | 2012-0125635 A | 11/2012 |
| WO | WO-2006/022650 | 3/2006 |
| WO | WO-2011/093003 | 8/2011 |
| WO | WO-2011/108374 | 9/2011 |
| WO | WO-2019/077901 | 4/2019 |
| WO | WO-2020/240341 | 12/2020 |
| WO | WO-2020/240348 | 12/2020 |

OTHER PUBLICATIONS

Written Opinion (Application No. PCT/IB2020/055591) Dated Sep. 24, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Kunitake.H et al., "A c-Axis-Aligned Crystalline In—Ga—Zn Oxide FET With a Gate Length of 21 nm Suitable for Memory Applications", Journal of the Electron Devices Society, Apr. 9, 2019, vol. 7, pp. 495-502.

\* cited by examiner

120

FIG. 9A
| | Intermediate state New crystalline phase | |
|---|---|---|
| Amorphous | Crystalline | Crystal |
| •completely amorphous | •CAAC •nc •CAC | •single crystal •poly crystal |
FIG. 9B
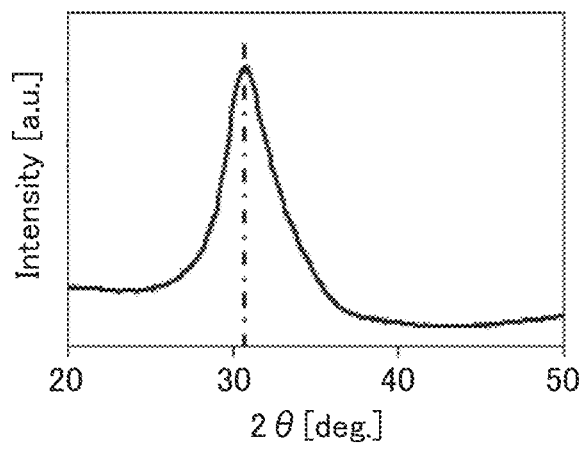
FIG. 9C
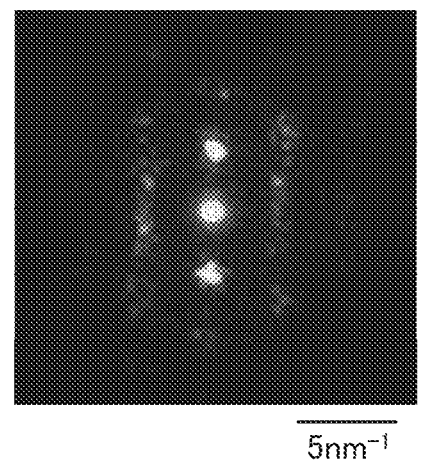

FIG. 17A
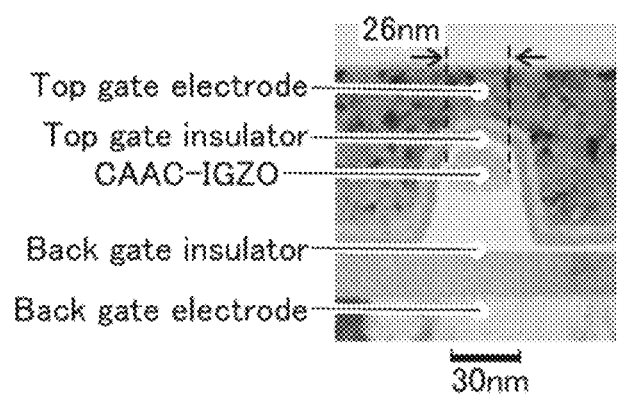
FIG. 17B    FIG. 17C
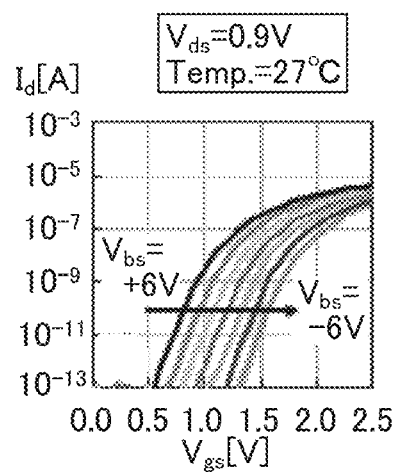
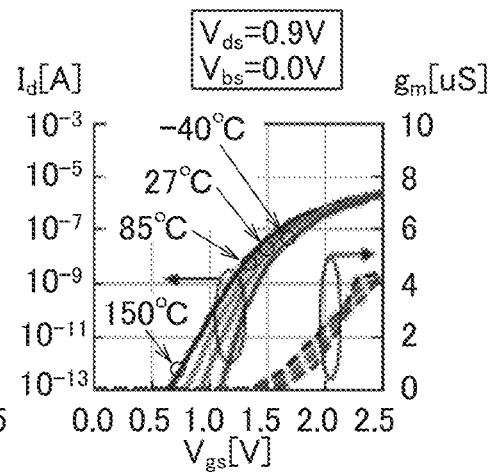

| | | |
|---|---|---|
| $C_{gs}$ | 14 | fF |
| $C_{gd1}$ | 14 | fF |
| $C_{gd2}$ | 8.0 | fF |
| $C_{ds}$ | 8.0 | fF |
| $g_m$ | 7.0 | mS |
| $g_d$ | 2.3 | mS |
| $R_g$ | 240 | Ω |
| $L_d$ | 0.05 | nH |
| $L_s$ | 0.10 | nH |
| $L_g$ | 0.37 | nH |

SEMICONDUCTOR DEVICE INCLUDING HIGH FREQUENCY AMPLIFIER CIRCUIT, ELECTRONIC COMPONENT, AND ELECTRONIC DEVICE

TECHNICAL FIELD

One embodiment of the present invention relates to a semiconductor device including a high frequency amplifier circuit (also referred to as a high frequency amplifier).

In this specification and the like, a semiconductor device refers to a device that utilizes semiconductor characteristics and indicates, for example, a circuit including a semiconductor element (a transistor, a diode, a photodiode, and the like), a device including the circuit, and the like. Note that in this specification and the like, a semiconductor device refers to any device that can function by utilizing semiconductor characteristics; examples of the semiconductor device include an integrated circuit, a chip provided with an integrated circuit, an electronic component in which a chip is incorporated in a package, and an electronic device provided with an integrated circuit.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

Information terminals that are easy to carry (also referred to as a portable information terminal), typified by smartphones, tablet terminals, and the like, have come into widespread use. With the widespread use of information terminals, various communication standards have been established. For example, the use of an LTE-Advanced standard called the fourth generation (4G) has started.

With the development of information technology such as IoT (Internet of Things), the amount of data handled in information terminals has been recently showing an increasing tendency. The communication speed of electronic devices such as portable information terminals needs to be improved.

In order to be compatible with various kinds of information technology such as IoT, a communication standard called the fifth generation (5G) that achieves higher communication speed, more simultaneous connections, and shorter delay time than 4G has been considered. Note that in Japan for example, 5G uses communication frequencies of a 3.7 GHz band, a 4.5 GHz band, and a 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2). Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] H. Kunitake et al., "Journal of the Electron Devices Society", 2019, volume 7, pp. 495-502.

SUMMARY OF THE INVENTION

Problems to be Solved by the Invention

A semiconductor device included in a portable information terminal is required to have not only improved communication speed, processing speed, and the like but also a small size and low power consumption. Out of semiconductor devices included in a portable information terminal, a high frequency amplifier circuit used for communication processing consumes a high proportion of power in the whole power consumed by the portable information terminal.

An object of one embodiment of the present invention is to provide a semiconductor device including a high frequency amplifier circuit with reduced power consumption. Another object of one embodiment of the present invention is to provide a semiconductor device including a high frequency amplifier circuit, in which an increase in circuit area is inhibited.

Note that one embodiment of the present invention does not necessarily achieve all the above-described objects and only needs to achieve at least one of the objects. The descriptions of the above-described objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a semiconductor device including a high frequency amplifier circuit, an envelope detection circuit, a comparator, and a power supply circuit. The envelope detection circuit includes a first transistor, and the first transistor contains a metal oxide in a channel formation region. An output of the high frequency amplifier circuit is input to the envelope detection circuit, an output of the envelope detection circuit is input to the comparator, an output of the comparator is input to the power supply circuit, and the power supply circuit supplies a power supply potential to the high frequency amplifier circuit.

In the above embodiment, the high frequency amplifier circuit, the comparator, and the power supply circuit each include a second transistor formed on a semiconductor substrate, and the first transistor is provided to be stacked over the semiconductor substrate.

One embodiment of the present invention is a semiconductor device including a high frequency amplifier circuit, an envelope detection circuit, a comparator, a smoothing circuit, and a power supply circuit. The envelope detection circuit includes a first transistor, and the first transistor contains a metal oxide in a channel formation region. An output of the high frequency amplifier circuit is input to the envelope detection circuit, an output of the envelope detection circuit is input to the comparator, an output of the comparator is input to the smoothing circuit, an output of the smoothing circuit is input to the power supply circuit, and the power supply circuit supplies a power supply potential to the high frequency amplifier circuit.

In the above embodiment, the high frequency amplifier circuit, the comparator, the smoothing circuit, and the power supply circuit each include a second transistor formed on a semiconductor substrate, and the first transistor is provided to be stacked over the semiconductor substrate.

One embodiment of the present invention is a semiconductor device including a high frequency amplifier circuit, an envelope detection circuit, an adder circuit, and a power supply circuit. The envelope detection circuit includes a first transistor, and the first transistor contains a metal oxide in a channel formation region. An output of the high frequency amplifier circuit is input to the envelope detection circuit, an output of the envelope detection circuit is input to the adder circuit, and an output of the adder circuit is input to the power supply circuit. An input of the adder circuit is supplied with an external supply potential, the adder circuit has a function of adding the external supply potential to the output of the envelope detection circuit, and the power supply circuit supplies a power supply potential to the high frequency amplifier circuit.

In the above embodiment, the high frequency amplifier circuit, the adder circuit, and the power supply circuit each include a second transistor formed on a semiconductor substrate, and the first transistor is provided to be stacked over the semiconductor substrate.

In the above embodiment, the metal oxide contains at least one of In and Zn.

Effect of the Invention

According to one embodiment of the present invention, a semiconductor device including a high frequency amplifier circuit with reduced power consumption can be provided. According to one embodiment of the present invention, a semiconductor device including a high frequency amplifier circuit, in which an increase in circuit area is inhibited, can be provided.

Note that one embodiment of the present invention does not necessarily achieve all the above-described objects and only needs to achieve at least one of the objects. The descriptions of the above-described objects do not preclude the existence of other objects. Objects other than these will be apparent from the descriptions of the specification, the claims, the drawings, and the like, and objects other than these can be derived from the descriptions of the specification, the claims, the drawings, and the like.

BRIEF DESCRIPTION OF THE DRAWINGS

FIG. 9A is a diagram showing the classification of crystal structures of IGZO. FIG. 9B is a diagram showing an XRD spectrum of a CAAC-IGZO film. FIG. 9C is a diagram showing a nanobeam electron diffraction pattern of a CAAC-IGZO film.

FIG. 17A is a cross-sectional view in the channel width direction. FIG. 17B and FIG. 17C are top gate voltage-drain current characteristics of the fabricated transistor.

MODE FOR CARRYING OUT THE INVENTION

Figure 1A:
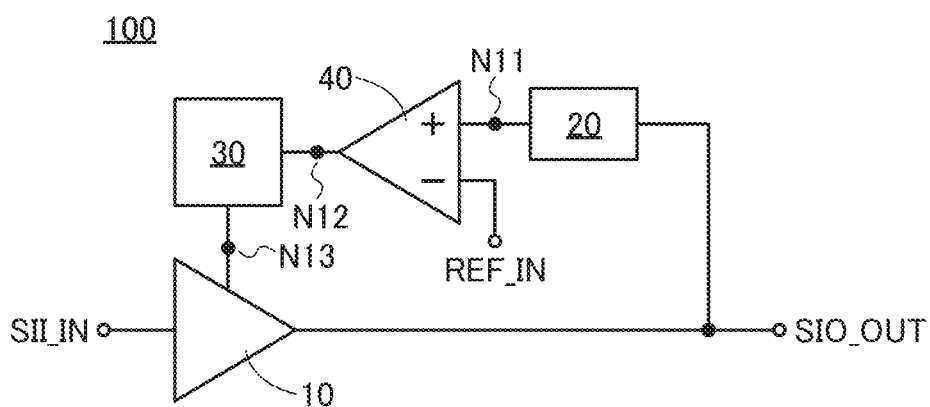
FIG. 1A and FIG. 1B are block diagrams illustrating structure examples of a semiconductor device.

Hereinafter, embodiments are described with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, an inductor, a capacitive element, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitive element" has a structure in which two electrodes face each other with an insulator (dielectric) therebetween. Furthermore, in this specification and the like, cases where a "capacitive element" is one having a structure in which two electrodes face each other with an insulator therebetween, one having a structure in which two wirings face each other with an insulator therebetween, or one in which two wirings are positioned with an insulator therebetween, are included. In this specification and the like, a "capacitive element" is referred to as a "condenser" or a "capacitor" in some cases.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. Further, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor including a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, a semiconductor device according to one embodiment of the present invention will be described. The semiconductor device according to one embodiment of the present invention includes a high frequency amplifier circuit, an envelope detection circuit, and a power supply circuit.

Structure Example 1 of Semiconductor Device

FIG. 1A is a block diagram illustrating a structure example of a semiconductor device 100 according to one embodiment of the present invention. The semiconductor device 100 illustrated in FIG. 1A includes a high frequency amplifier circuit 10, an envelope detection circuit 20, a comparator 40, and a power supply circuit 30. In addition, the semiconductor device 100 includes an input terminal SII_IN, an input terminal REF_IN, and an output terminal SIO_OUT.

Note that in the drawings described in this specification and the like, the flow of main signals is indicated by an arrow or a line, and a power supply line and the like are omitted in some cases. In the drawings described in this specification and the like, the expression "input terminal" or "output terminal" is used for describing a portion to which a signal or potential is input or from which a signal or potential is output; in an actual circuit, only electric connection is made with a wiring, an electrode, or the like without a physical connection portion in some cases.

The input terminal SII_IN is electrically connected to an input terminal of the high frequency amplifier circuit 10, and an output terminal of the high frequency amplifier circuit 10 is electrically connected to the output terminal SIO_OUT and an input terminal of the envelope detection circuit 20.

An output terminal of the envelope detection circuit 20 is electrically connected to a non-inverting input terminal of the comparator 40 (denoted as "+" in FIG. 1A), and an inverting input terminal of the comparator 40 (denoted as "−" in FIG. 1A) is electrically connected to the input terminal REF_IN. A predetermined potential is supplied to the input terminal REF_IN from the outside of the semiconductor device 100, and the comparator 40 has a function of amplifying a potential difference input to the non-inverting input terminal and the inverting input terminal.

An output terminal of the comparator 40 is electrically connected to an input terminal of the power supply circuit 30, an output terminal of the power supply circuit 30 is electrically connected to the high frequency amplifier circuit 10, and the power supply circuit 30 supplies a power supply potential to the high frequency amplifier circuit 10. The power supply circuit 30 has a function of referring to the potential input to the input terminal of the power supply circuit 30 and supplying a power supply potential corresponding to the potential input to the input terminal.

Figure 1B:
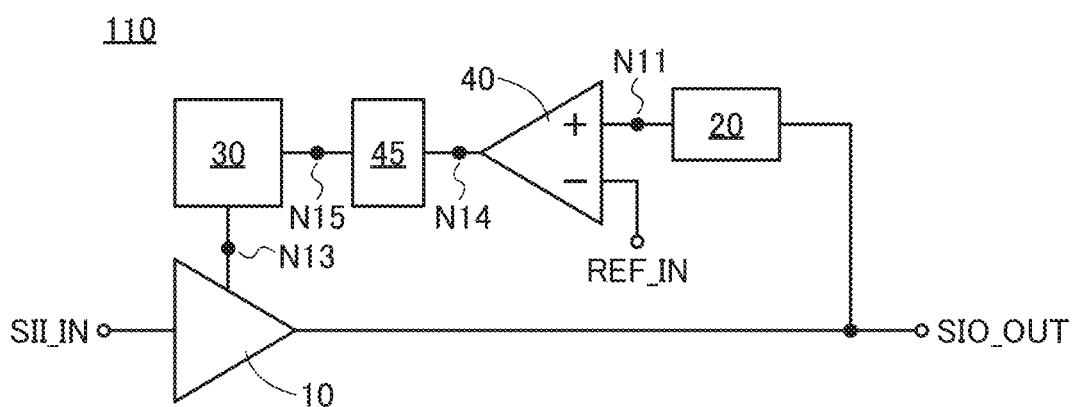

The semiconductor device 100 may include a smoothing circuit 45. FIG. 1B is a block diagram illustrating a structure example of a semiconductor device 110. The semiconductor device 110 includes the smoothing circuit 45 in addition to the components included in the semiconductor device 100. The smoothing circuit 45 is provided between the output terminal of the comparator 40 and the input terminal of the power supply circuit 30. In other words, the output terminal of the comparator 40 is electrically connected to an input terminal of the smoothing circuit 45, and an output terminal of the smoothing circuit 45 is electrically connected to the input terminal of the power supply circuit 30. Note that in the semiconductor device 110, components similar to those in the semiconductor device 100 are not described.

Here, the connection portion where the output terminal of the envelope detection circuit 20 and the non-inverting input terminal of the comparator 40 are electrically connected to each other is referred to as a node N11, the connection portion where the output terminal of the comparator 40 and the input terminal of the power supply circuit 30 are electrically connected to each other is referred to as a node N12, and the connection portion where the output terminal of the power supply circuit 30 and the high frequency amplifier circuit 10 are electrically connected to each other is referred to as a node N13. In the semiconductor device 110, the connection portion where the output terminal of the comparator 40 and the input terminal of the smoothing circuit 45 are electrically connected to each other is referred to as a node N14, and the connection portion where the output terminal of the smoothing circuit 45 and the input terminal of the power supply circuit 30 are electrically connected to each other is referred to as a node N15.

Figure 1C:
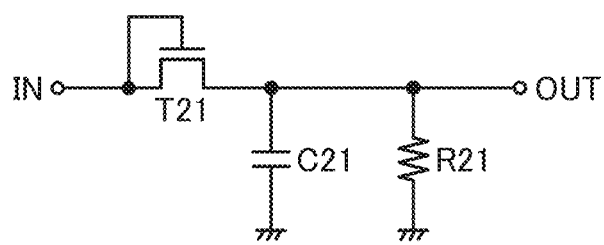
FIG. 1C is a circuit diagram illustrating a structure example of an envelope detection circuit.

FIG. 1C is a circuit diagram illustrating a structure example of the envelope detection circuit 20. The envelope detection circuit 20 illustrated in FIG. 1C includes a transistor T21, a capacitor C21, and a resistor R21. In addition, the envelope detection circuit 20 includes an input terminal IN and an output terminal OUT.

In the envelope detection circuit 20, the input terminal IN is electrically connected to a gate of the transistor T21 and one of a source and a drain of the transistor T21; and the other of the source and the drain of the transistor T21 is electrically connected to one terminal of the capacitor C21, one terminal of the resistor R21, and the output terminal OUT. The other terminal of the capacitor C21 and the other terminal of the resistor R21 are electrically connected to a reference potential, for example. In the transistor T21, the gate of the transistor T21 and the one of the source and the drain are electrically connected to each other, and the transistor T21 has a function of a diode.

<Transistor>

Here, the transistor T21 is an OS transistor. An OS transistor has the following features: the off-state current is extremely low, the off-state current is unlikely to increase even under a high temperature environment, a high voltage can be applied between a source and a drain, the transistor can be provided to be stacked because it can be formed by a method such as a thin film method, and low-cost manufacturing is possible because a manufacturing apparatus similar to that for a Si transistor (a transistor formed on a single crystal silicon substrate) can be used, for example.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 2 and Embodiment 3.

For example, in a channel formation region of the transistor T21, a metal oxide containing at least any one of indium, the element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Since an OS transistor can be formed by a method such as a thin film method, for example, the transistor T21 can be provided to be stacked over a circuit including a Si transistor formed on a single crystal silicon substrate and the like. In other words, the circuit area of the semiconductor device 100 can be inhibited from being increased (the semiconductor device 100 can be small) when a Si transistor formed on a single crystal silicon substrate is used in the components included in the semiconductor device 100 other than the envelope detection circuit 20, and the envelope detection circuit 20 is provided to be stacked over the above components.

Moreover, the transistor T21 may include a back gate. In the case where the transistor T21 includes a back gate, the threshold voltage of the transistor T21 can be increased and decreased by application of a predetermined potential to the back gate of the transistor T21. Alternatively, when the back gate of the transistor T21 is electrically connected to the gate of the transistor T21, the on-state current of the transistor T21 can be increased.

<Operation Example of Semiconductor Device>

Figure 2A:
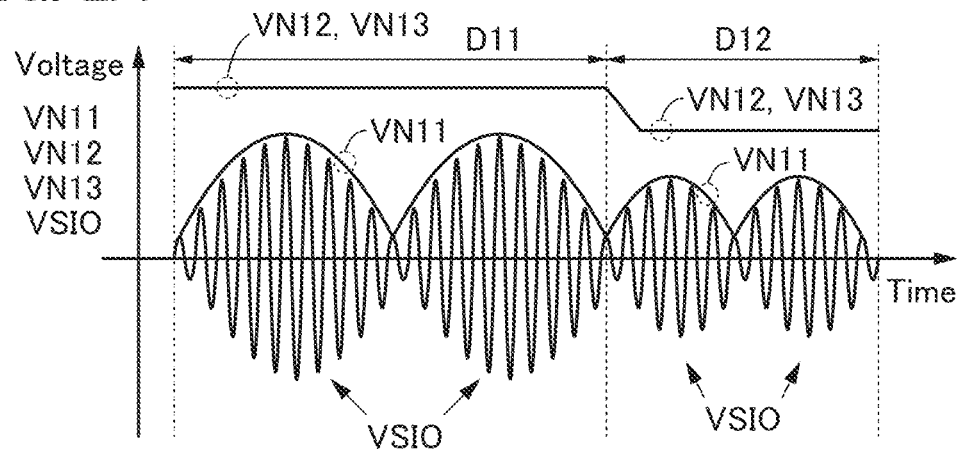
FIG. 2A and FIG. 2B are diagrams illustrating potential relations between terminals and nodes.

An operation example of the semiconductor device 100 will be described with reference to FIG. 2A. FIG. 2A is a diagram illustrating a potential relation between the output terminal SIO_OUT and the node N11 to the node N13. In FIG. 2A, the potential of the output terminal SIO_OUT is denoted as a potential VSIO, and the potentials of the node N11 to the node N13 are respectively denoted as a potential VN11 to a potential VN13.

FIG. 2A illustrates, as an example, the case where an amplitude-modulated high-frequency signal is input to the input terminal SII_IN of the semiconductor device 100. The high-frequency signal input to the input terminal SII_IN of the semiconductor device 100 is amplified by the high frequency amplifier circuit 10 and output to the output terminal SIO_OUT.

The signal output to the output terminal SIO_OUT (denoted as the potential VSIO) is input to the envelope detection circuit 20, and the envelope detection circuit 20 removes a high-frequency component of a carrier wave from the input signal and outputs to the node N11. The signal output to the node N11 (denoted as the potential VN11) has a waveform similar to an envelope of the signal input to the envelope detection circuit 20.

The comparator 40 compares the signal output to the node N11 and the potential supplied to the input terminal REF_IN and outputs a signal to the node N12. Note that FIG. 2A illustrates the case where the amplitude of the signal output to the output terminal SIO_OUT is different between a period D11 and a period D12. FIG. 2A illustrates the state where in accordance with the amplitude of the signal output to the output terminal SIO_OUT, the signal output to the node N11 is changed and the signal output to the node N12 (denoted as the potential VN12) is changed.

Specifically, the amplitude of the signal output to the output terminal SIO_OUT in the period D12 is smaller than the amplitude of the signal output in the period D11. The amplitude of the signal output to the node N11 in the period D12 is also smaller than the amplitude of the signal output in the period D11, and the potential VN12 in the period D12 is lower than the potential VN12 in the period D11.

The power supply circuit 30 refers to the signal output to the node N12 and outputs a power supply potential (denoted as the potential VN13) to the node N13. Although FIG. 2A illustrates the case where the potential VN12 and the potential VN13 are the same, the potential VN12 and the potential VN13 may be different potentials.

Figure 2B:
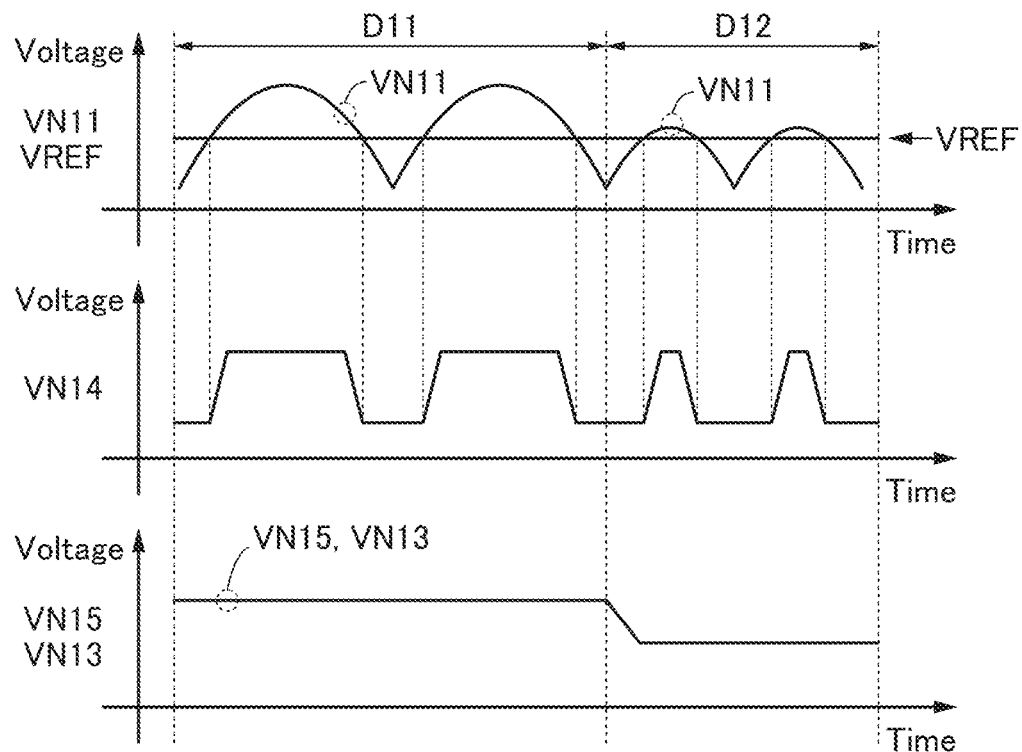

Next, an operation example of the semiconductor device 110 will be described with reference to FIG. 2B. In the semiconductor device 110, the potential of the output terminal SIO_OUT and the potential of the node N11 are the same as those in the semiconductor device 100; thus, the potential of the output terminal SIO_OUT is omitted in FIG. 2B. FIG. 2B is a diagram illustrating a potential relation between the node N11, the input terminal REF_IN, and the node N13 to the node N15.

In FIG. 2B, the potential of the node N11 is denoted by the potential VN11, the potential of the input terminal REF_IN is denoted as a potential VREF, and the potentials of the node N13 to the node N15 are respectively denoted as the potential VN13 to a potential VN15. Note that in FIG. 2B, the potential VN11 and the potential VREF, the potential VN14, and the potential VN15 and the potential VN13 are separately illustrated in a graph for visibility of the diagram.

In FIG. 2B, the description of the potential VN11 is omitted because the potential VN11 is the same as that in the semiconductor device 100, and the comparator 40 compares the signal output to the node N11 and the potential supplied to the input terminal REF_IN and outputs a signal to the node N14. Here, the potential VN14 is illustrated on the assumption that the comparator 40 is highly responsive to an input signal.

In other words, in the case where the potential VN11 is higher than the potential VREF, the comparator 40 outputs a high potential that can be output (also referred to as a high level) to the node N14; in the case where the potential VN11 is lower than the potential VREF, the comparator 40 outputs a low potential that can be output (also referred to as a low level) to the node N14. Then, the smoothing circuit 45 smooths the signal output to the node N14 and outputs a signal to the node N15.

In FIG. 2B, as in FIG. 2A, the amplitude of the signal output to the node N11 in the period D12 is smaller than the amplitude of the signal output in the period D11. The comparator 40 outputs a high level in the case where the potential VN11 is higher than the potential VREF, in which case the time for which the node N14 is at a high level is shorter in the period D12 than that in the period D11. The smoothing circuit 45 smooths the signal output to the node N14, and the potential VN15 in the period D12 is lower than the potential VN15 in the period D11.

The power supply circuit 30 refers to the signal output to the node N15 and outputs a power supply potential (denoted as the potential VN13) to the node N13. Although FIG. 2B illustrates the case where the potential VN15 and the potential VN13 are the same, the potential VN15 and the potential VN13 may be different potentials.

Structure Example 2 of Semiconductor Device

Figure 3A:
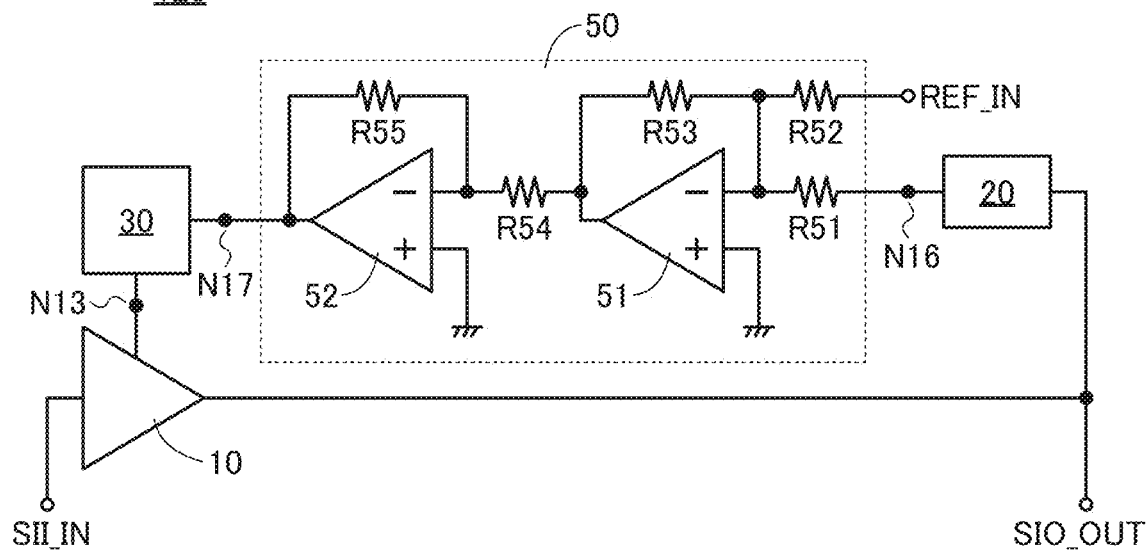
FIG. 3A is a block diagram illustrating a structure example of a semiconductor device.

The semiconductor device 100 may include an adder circuit instead of the comparator 40. FIG. 3A is a block diagram illustrating a structure example of a semiconductor device 120. The semiconductor device 120 includes, instead of the comparator 40, an operational amplifier 51, an operational amplifier 52, and a resistor R51 to a resistor R55.

The output terminal of the envelope detection circuit 20 is electrically connected to one terminal of the resistor R51; the other terminal of the resistor R51 is electrically connected to an inverting input terminal of the operational amplifier 51 (denoted as "—" in FIG. 3A), one terminal of the resistor R52, and one terminal of the resistor R53; and the other terminal of the resistor R52 is electrically connected to the input terminal REF_IN. A non-inverting input terminal of the operational amplifier 51 (denoted as "+" in FIG. 3A) is electrically connected to a reference potential.

The other terminal of the resistor R53 is electrically connected to one terminal of the resistor R54 and an output terminal of the operational amplifier 51; the other terminal of the resistor R54 is electrically connected to one terminal of the resistor R55 and an inverting input terminal of the operational amplifier 52; and a non-inverting input terminal of the operational amplifier 52 is electrically connected to a reference potential. The other terminal of the resistor R55 is electrically connected to an output terminal of the operational amplifier 52 and the input terminal of the power supply circuit 30.

In the semiconductor device 120, the connection portion where the output terminal of the envelope detection circuit 20 and the one terminal of the resistor R51 are electrically connected to each other is referred to as a node N16, and the connection portion where the other terminal of the resistor R55, the output terminal of the operational amplifier 52, and the input terminal of the power supply circuit 30 are electrically connected to each other is referred to as a node N17. The operational amplifier 51, the operational amplifier 52, and the resistor R51 to the resistor R55 form an adder circuit 50. Note that in the semiconductor device 120, components similar to those in the semiconductor device 100 are not described.

Figure 3B:
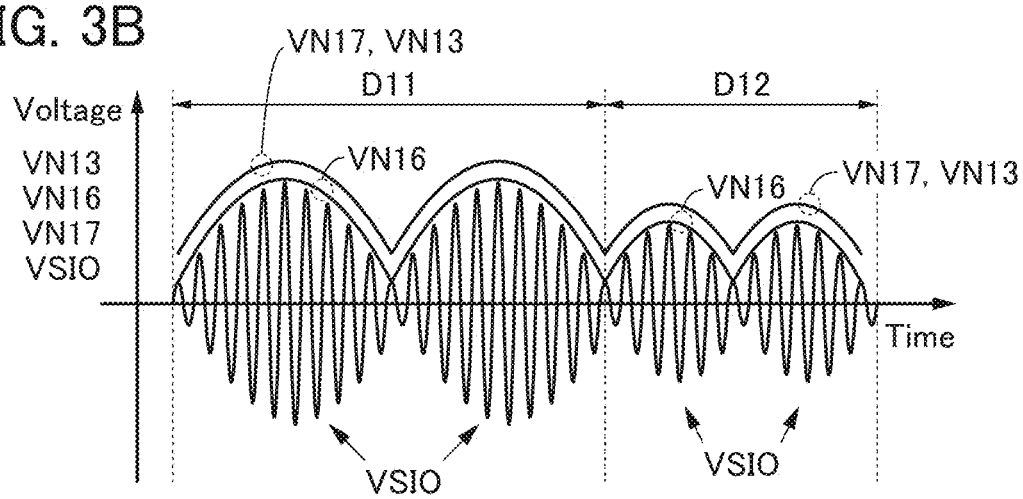
FIG. 3B is a diagram illustrating a potential relation between a terminal and nodes.

FIG. 3B is a diagram illustrating a potential relation between the output terminal SIO_OUT, the node N16, the node N17, and the node N13. In FIG. 3B, the potential of the output terminal SIO_OUT is denoted as the potential VSIO, the potential of the node N16 is denoted as a potential VN16, the potential of the node N17 is denoted as a potential VN17, and the potential of the node N13 is denoted as the potential VN13. Note that the potential VSIO and the potential VN16 are respectively the same as the potential VSIO and the potential VN11 in the semiconductor device 100 (see FIG. 2A), and thus the description thereof is omitted.

In the adder circuit 50, for example, the resistance values of the resistor R51 to the resistor R53 can be the same value, and the resistance values of the resistor R54 and the resistor R55 can be the same value. In the case where the resistance values of the resistor R51 to the resistor R53 are the same value and the resistance values of the resistor R54 and the resistor R55 are the same value, the adder circuit 50 adds a signal output to the node N16 and the potential supplied to the input terminal REF_IN, and outputs a signal to the node N17. Accordingly, the adder circuit 50 can make the potential of the node N17 a potential obtained by adding the potential supplied to the input terminal REF_IN to the potential of the node N16. The potential supplied to the input terminal REF_IN is preferably a potential set in consideration of margins of the output signal of the high frequency amplifier circuit 10 and the power supply potential supplied to the high frequency amplifier circuit 10.

The power supply circuit 30 refers to the signal output to the node N17 and outputs a power supply potential (denoted as the potential VN13) to the node N13. Although FIG. 3B illustrates the case where the potential VN17 and the potential VN13 are the same, the potential VN17 and the potential VN13 may be different potentials.

<Semiconductor Device>

In this embodiment, the semiconductor device 100, the semiconductor device 110, and the semiconductor device 120, each of which includes a high frequency amplifier circuit, an envelope detection circuit, and a power supply circuit, are described. In the semiconductor device 100, the semiconductor device 110, and the semiconductor device 120, the power supply circuit 30 can supply a power supply potential corresponding to the amplitude of the signal output to the output terminal SIO_OUT by the high frequency amplifier circuit 10. In other words, when the amplitude of the signal output to the output terminal SIO_OUT is small, the power supply potential supplied to the high frequency amplifier circuit 10 is lowered, whereby the power consumption of the semiconductor device can be reduced.

When the envelope detection circuit 20 includes an OS transistor, the envelope detection circuit 20 can be provided to be stacked over a circuit including a Si transistor formed on a single crystal silicon substrate and the like, for example. With the envelope detection circuit 20 provided to be stacked, the circuit area of the semiconductor device can be inhibited from being increased (the semiconductor device can be small).

Although an example in which an OS transistor is used in the envelope detection circuit 20 is described in this embodiment, an OS transistor may be used in the components, such as the comparator 40, included in the semiconductor device 100 (or the semiconductor device 110 or the semiconductor device 120) other than the envelope detection circuit 20.

Note that this embodiment can be implemented in appropriate combination with the other embodiments described in this specification.

Embodiment 2

In this embodiment, structures of transistors that can be used in the semiconductor device described in the above embodiment will be described. For example, a structure in which transistors having different electrical characteristics are stacked will be described. With the structure, the degree of freedom in design of the semiconductor device can be increased. Stacking transistors having different electrical characteristics can increase the degree of integration of the semiconductor device.

Figure 4:
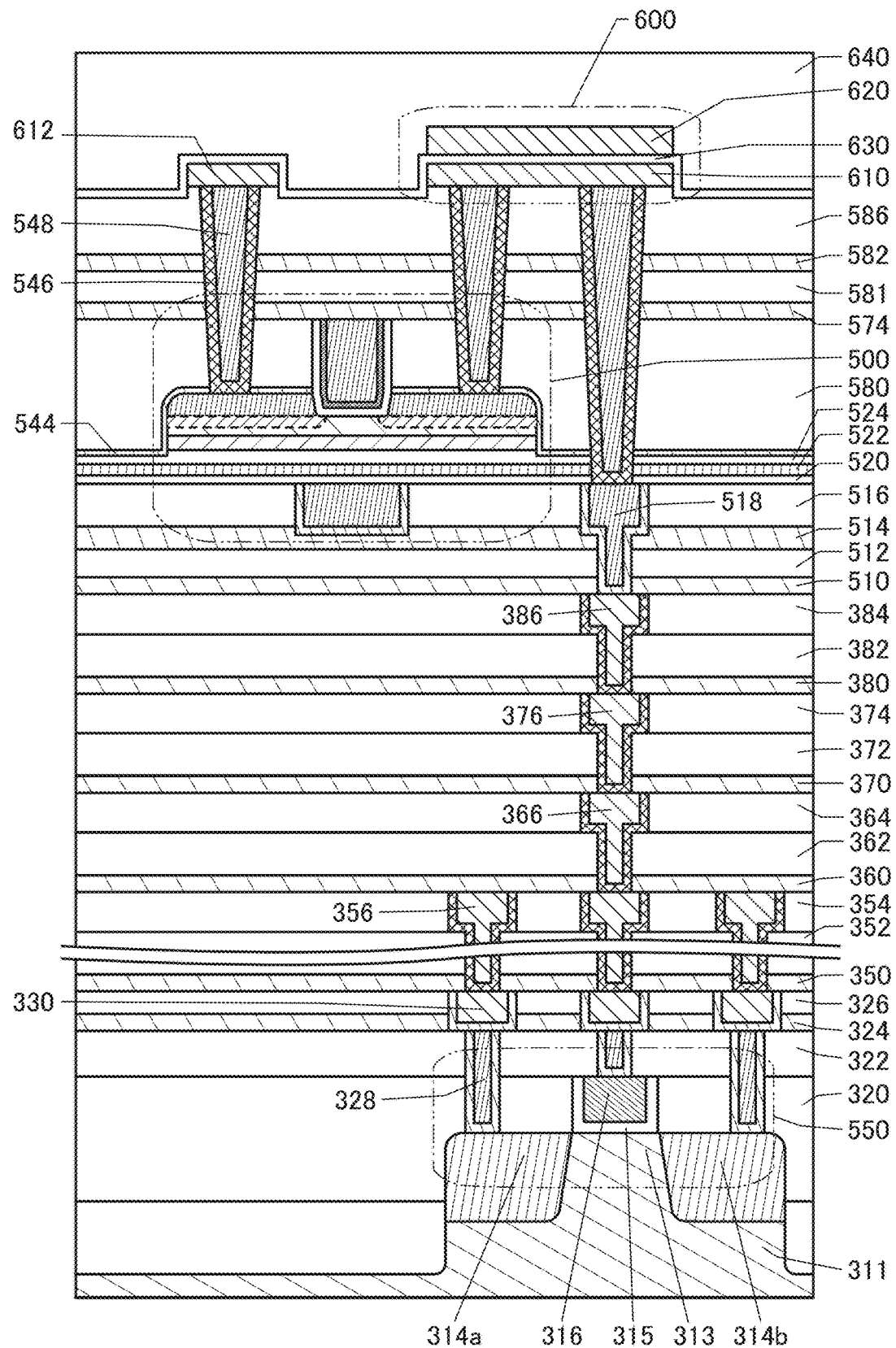
FIG. 4 is a diagram illustrating a structure example of a semiconductor device.
Figure 6A:
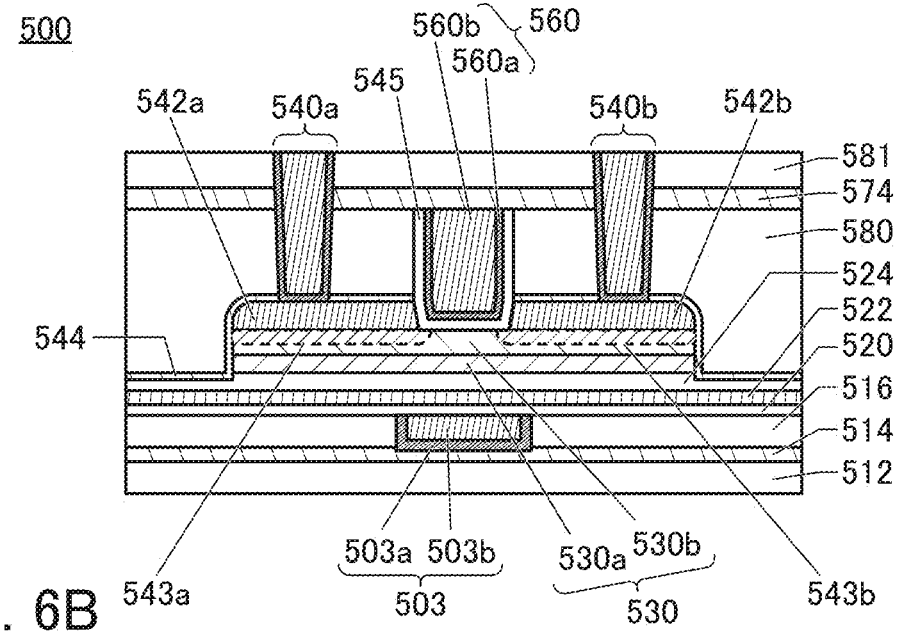
FIG. 6A to FIG. 6C are diagrams illustrating structure examples of transistors.
Figure 6B:
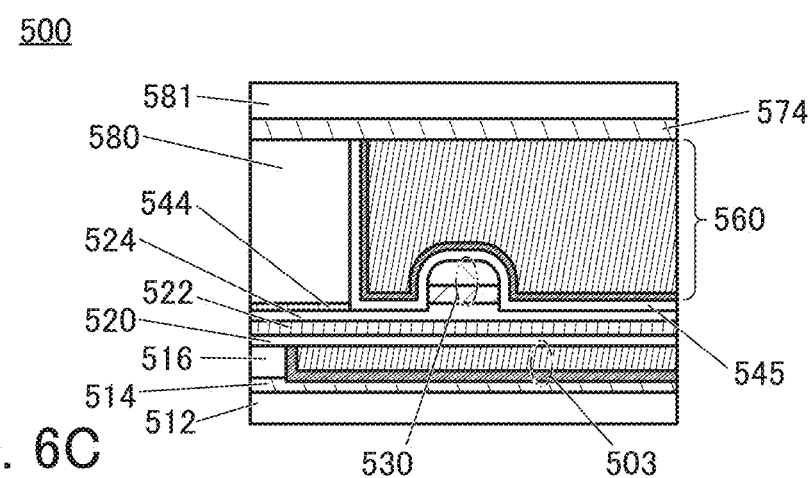
Figure 6C:
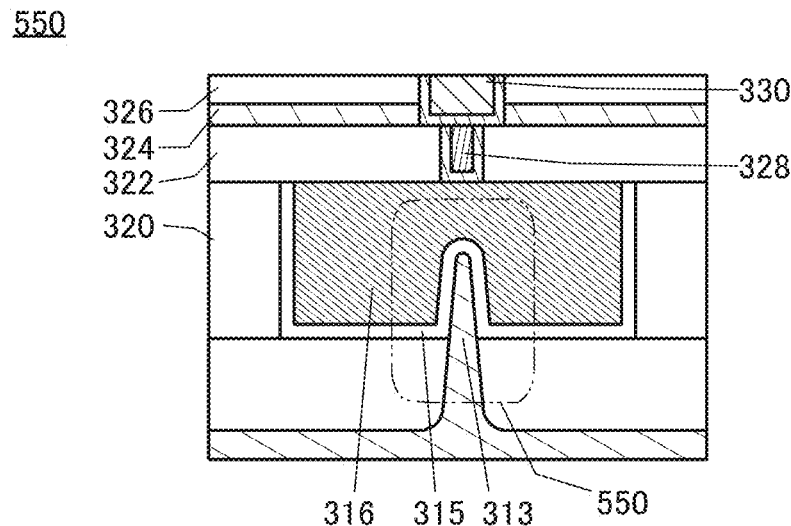

FIG. 4 illustrates part of a cross-sectional structure of a semiconductor device. A semiconductor device illustrated in FIG. 4 includes a transistor 550, a transistor 500, and a capacitor 600. FIG. 6A is a cross-sectional view of the transistor 500 in the channel length direction, FIG. 6B is a cross-sectional view of the transistor 500 in the channel width direction, and FIG. 6C is a cross-sectional view of the transistor 550 in the channel width direction.

The transistor 500 corresponds to, for example, the transistor T21 described in the above embodiment, and the transistor 500 includes, in addition to a first gate (also referred to as a top gate, or simply a gate), a second gate (also referred to as a bottom gate or a back gate). Furthermore, the transistor 550 corresponds to, for example, a transistor used in the components included in the semiconductor device 100 other than the envelope detection circuit 20, and the capacitor 600 corresponds to the capacitor C21.

The transistor 500 is an OS transistor. The transistor 500 has the following features: the off-state current is extremely low, the off-state current is unlikely to increase even under a high temperature environment, a high voltage can be applied between a source and a drain, the transistor can be provided to be stacked because it can be formed by a method such as a thin film method, and low-cost manufacturing is possible because a manufacturing apparatus similar to that for a Si transistor can be used, for example.

In FIG. 4, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 6C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used.

Note that the work function depends on a material for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate formed in such a manner that after an oxygen ion is implanted into a mirror-polished wafer, an oxide layer is formed at a certain depth from the surface and defects generated in a surface layer are eliminated by high-temperature annealing; or an SOI substrate formed by a Smart-Cut method in which a semiconductor substrate is cleaved by utilizing growth of a minute void, which is formed by implantation of a hydrogen ion, by heat treatment, an ELTRAN method (registered trademark: Epitaxial Layer Transfer), or the like. A transistor formed using a single crystal substrate contains a single crystal semiconductor in a channel formation region.

Figure 5:
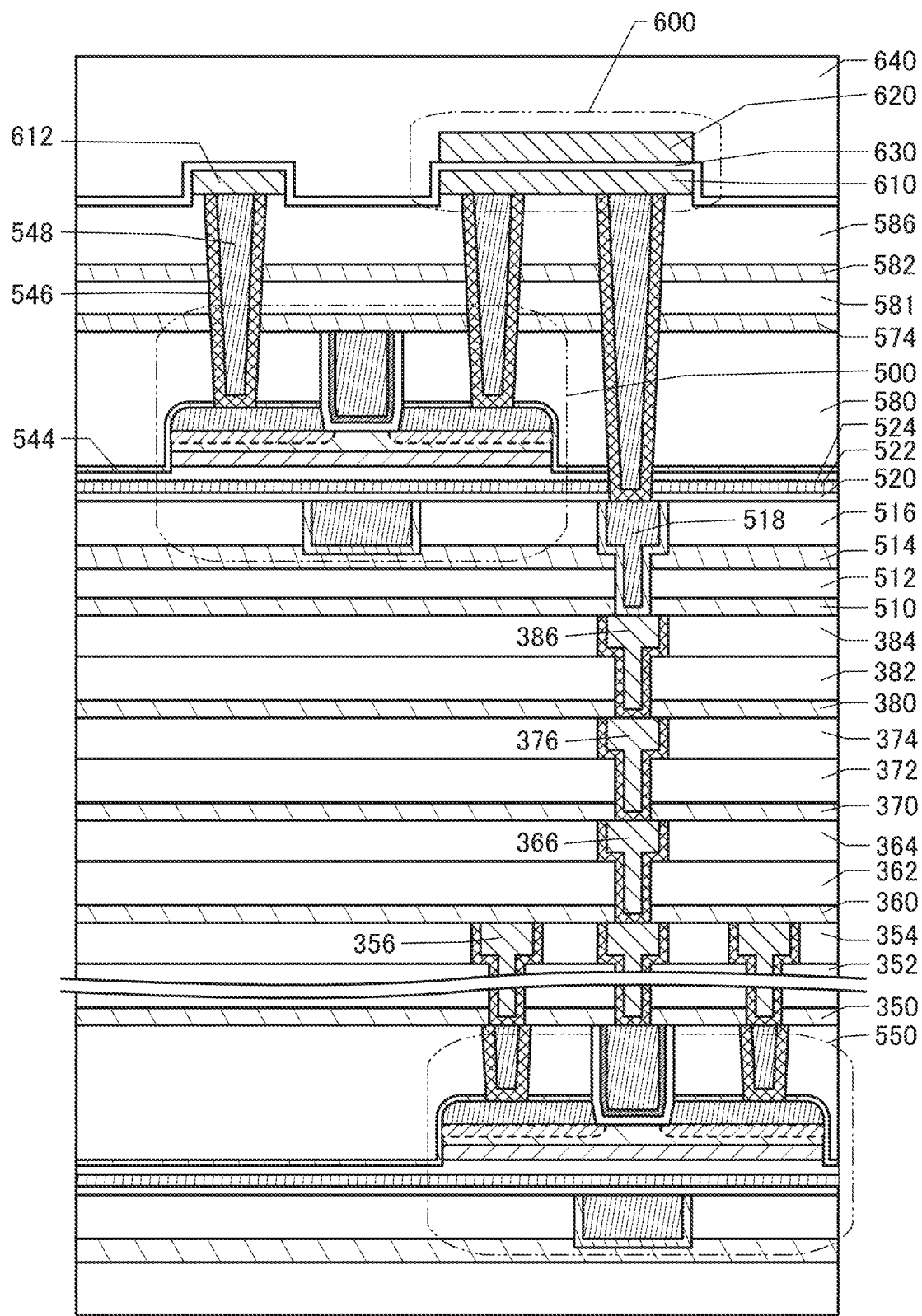
FIG. 5 is a diagram illustrating a structure example of a semiconductor device.

Note that the transistor 550 illustrated in FIG. 4 is an example and the structure is not limited thereto; an appropriate transistor can be used in accordance with a circuit structure or a driving method. For example, when the semiconductor device is a single-polarity circuit using only OS transistors (which means a circuit including only transistors having the same polarity, e.g., only n-channel transistors), the transistor 550 has a structure similar to that of the transistor 500 as illustrated in FIG. 5. Note that the details of the transistor 500 will be described later.

An insulator 320, an insulator 322, an insulator 324, and an insulator 326 are stacked in this order to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

For the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Thus, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases, and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 4, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably includes a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity of a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 4, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably includes a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 4, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably includes a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 4, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably includes a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Thus, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 6A and FIG. 6B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 6A and FIG. 6B, an insulator 544 is preferably positioned between the insulator 580 and the oxide 530a, the oxide 530b, the conductor 542a, and the conductor 542b. Furthermore, as illustrated in FIG. 6A and FIG. 6B, the conductor 560 preferably includes a conductor 560a provided on the inner side of the insulator 545 and a conductor 560b provided to be embedded on the inner side of the conductor 560a. Moreover, as illustrated in FIG. 6A and FIG. 6B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. The transistor 500 illustrated in FIG. 4, FIG. 5, and FIG. 6A is an example, and the structure is not limited thereto; an appropriate transistor can be used in accordance with a circuit structure, a driving method, or the like.

Here, the conductor 560 functions as a gate electrode of the transistor, and the conductor 542a and the conductor 542b function as a source electrode and a drain electrode. As described above, the conductor 560 is formed to be embedded in the opening in the insulator 580 and the region between the conductor 542a and the conductor 542b. The positions of the conductor 560, the conductor 542a, and the conductor 542b with respect to the opening in the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the conductor 560 enables the transistor 500 to have high frequency characteristics.

The conductor 560 sometimes functions as a first gate electrode. In addition, the conductor 503 sometimes functions as a second gate electrode. In such cases, the threshold voltage of the transistor 500 can be controlled by changing a potential applied to the conductor 503 independently of a potential applied to the conductor 560. In particular, the threshold voltage of the transistor 500 can be higher and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by stress such as heat or an electric field; thus, a large amount of hydrogen in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (also described as "dehydration" or "dehydrogenation treatment") and supply oxygen to the oxide semiconductor to fill oxygen vacancies (also described as "oxygen adding treatment") in order to obtain an oxide semiconductor whose VoH is sufficiently reduced. When an oxide semiconductor with sufficiently reduced impurities such as VoH is used for a channel formation region of a transistor, the transistor can have stable electrical characteristics.

For the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of VoH→Vo+H occurs. Part of hydrogen generated at this time is bonded to oxygen to be H$_2$O, and removed from the oxide 530 or an insulator near the oxide 530 in some cases. Part of hydrogen is gettered by the conductor 542 in other cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator near the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of Vo+O→null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

The insulator 522 preferably has a function of inhibiting diffusion of oxygen or impurities, in which case oxygen contained in the oxide 530 is not diffused to the insulator 520 side. Furthermore, the conductor 503 can be inhibited from reacting with oxygen contained in the insulator 524 or the oxide 530.

For the insulator 522, it is preferable to use a single layer or stacked layers of an insulator containing aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST), for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used for the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high dielectric constant.

Note that in the transistor 500 in FIG. 6A and FIG. 6B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap of 2 eV or more, preferably 2.5 eV or more. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion between the oxide 530a and the oxide 530b. In other words, the energy level of the conduction band minimum at the junction portion between the oxide 530a and the oxide 530b continuously changes or is continuously connected. To obtain this, the density of defect states in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 6A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 6A, a region 543a and a region 543b are sometimes formed as low-resistance regions at and near an interface between the oxide 530 and the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably reduced. The thickness of the insulator 545 is preferably greater than or equal to 1 nm and less than or equal to 20 nm.

To efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 6A and FIG. 6B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. The conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

When the insulator 580 that releases oxygen by heating is provided, oxygen in the insulator 580 can be efficiently supplied to the oxide 530. Note that the concentration of impurities such as water and hydrogen in the insulator 580 is preferably reduced.

The opening in the insulator 580 is formed to overlap with the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water and hydrogen in the insulator 581 is preferably reduced.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide included in the transistor 500 can be inhibited. Therefore, aluminum oxide is suitably used for the protective film of the transistor 500.

An insulator 586 is provided over the insulator 582. For the insulator 586, a material similar to that for the insulator 320 can be used. When a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are described in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base material film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 7A:
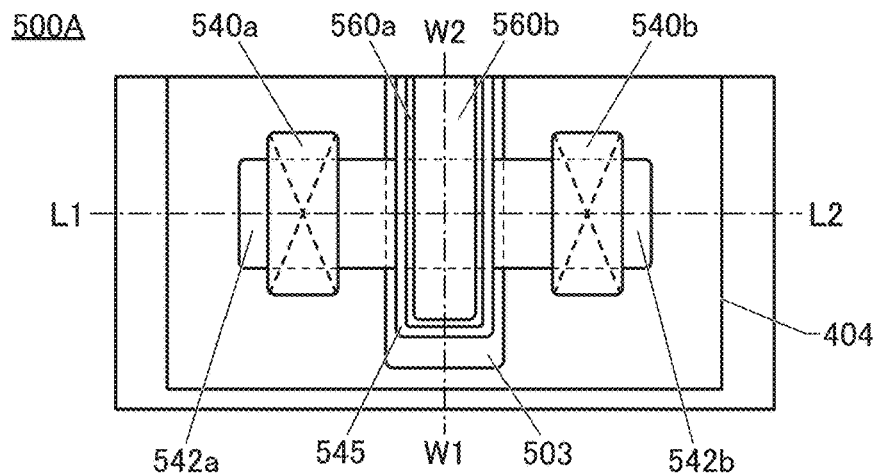
FIG. 7A to FIG. 7C are diagrams illustrating a structure example of a transistor.
Figure 7B:
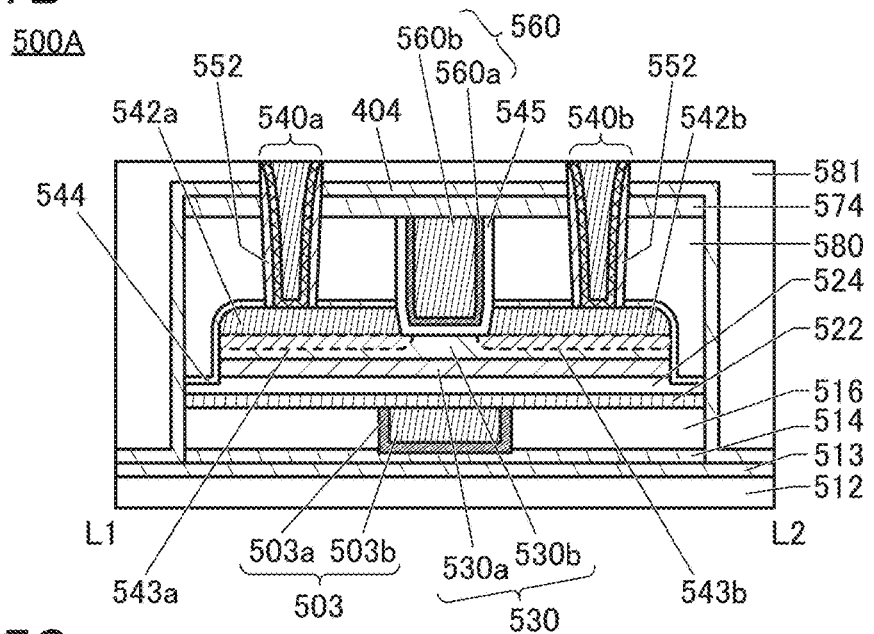
Figure 7C:
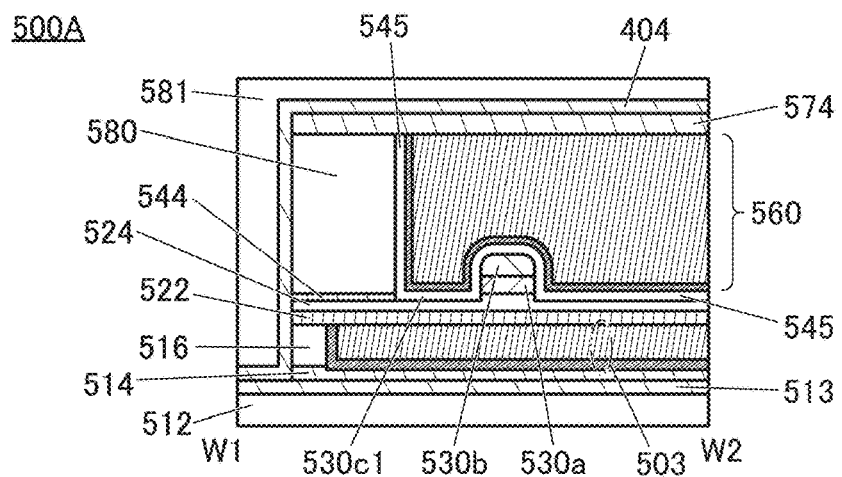

A transistor 500A illustrated in FIG. 7A, FIG. 7B, and FIG. 7C is a modification example of the transistor 500 having the structure illustrated in FIG. 6A and FIG. 6B. FIG. 7A is a top view of the transistor 500A, FIG. 7B is a cross-sectional view of the transistor 500A in the channel length direction, and FIG. 7C is a cross-sectional view of the transistor 500A in the channel width direction. Note that for clarity of the drawing, some components are not illustrated in the top view of FIG. 7A. Note that the structure illustrated in FIG. 7A, FIG. 7B, and FIG. 7C can also be employed for other transistors, such as the transistor 550, included in the semiconductor device of one embodiment of the present invention.

The transistor 500A having the structure illustrated in FIG. 7A, FIG. 7B, and FIG. 7C is different from the transistor 500 having the structure illustrated in FIG. 6A and FIG. 6B in that an insulator 552, an insulator 513, and an insulator 404 are included. Furthermore, the transistor 500A is different from the transistor 500 having the structure illustrated in FIG. 6A and FIG. 6B in that the insulator 552 is provided in contact with a side surface of the conductor 540a and a side surface of the conductor 540b. Moreover, the transistor 500A is different from the transistor 500 having the structure illustrated in FIG. 6A and FIG. 6B in that the insulator 520 is not included.

In the transistor 500A having the structure illustrated in FIG. 7A, FIG. 7B, and FIG. 7C, the insulator 513 is provided over the insulator 512. The insulator 404 is provided over the insulator 574 and the insulator 513.

In the transistor 500A having the structure illustrated in FIG. 7A, FIG. 7B, and FIG. 7C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 8A:
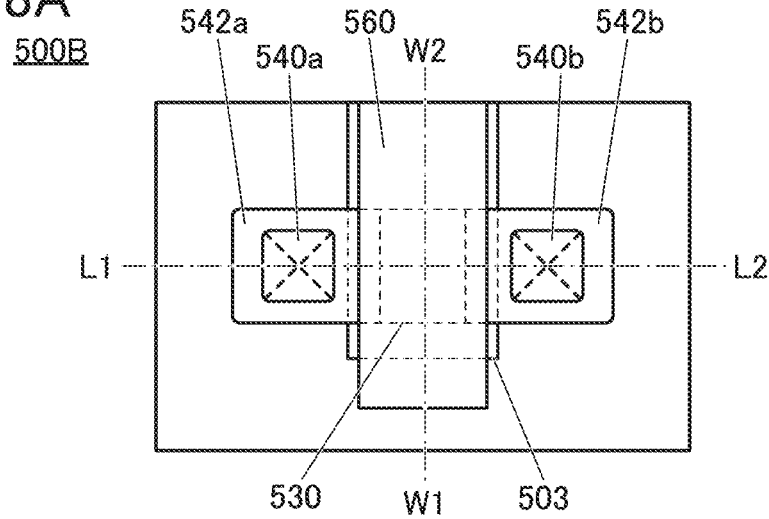
FIG. 8A to FIG. 8C are diagrams illustrating a structure example of a transistor.
Figure 8B:
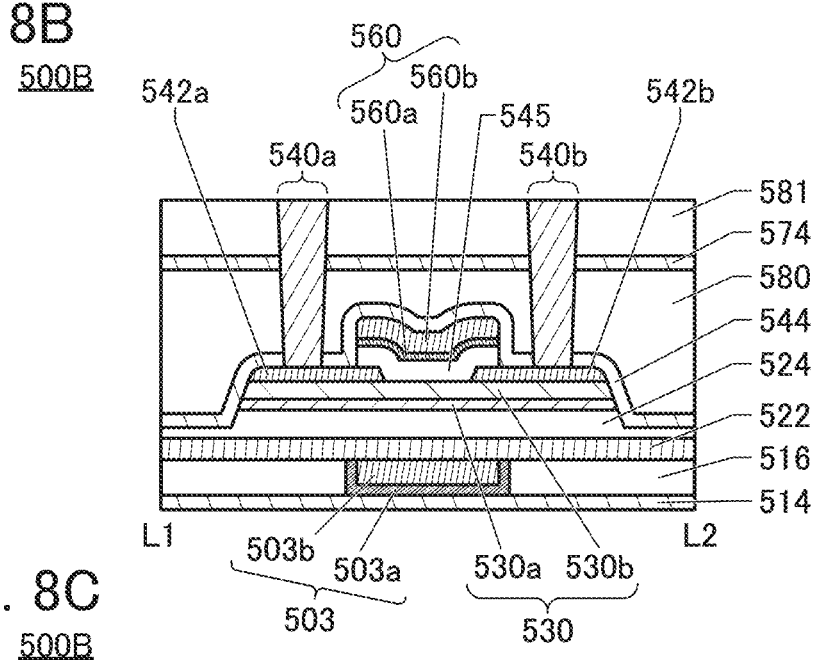
Figure 8C:
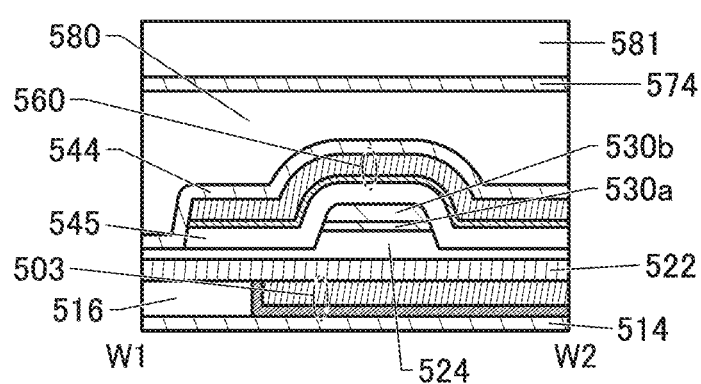

A structure example of a transistor 500B is described with reference to FIG. 8A, FIG. 8B, and FIG. 8C. FIG. 8A is a top view of the transistor 500B. FIG. 8B is a cross-sectional view of a portion indicated by a dashed-dotted line L1-L2 in FIG. 8A. FIG. 8C is a cross-sectional view of a portion indicated by a dashed-dotted line W1-W2 in FIG. 8A. Note that for clarity of the drawing, some components are not illustrated in the top view of FIG. 8A.

The transistor 500B is a modification example of the transistor 500 and can be replaced with the transistor 500. Thus, differences of the transistor 500B from the transistor 500 will be mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments and the like.

Embodiment 3

In this embodiment, an oxide semiconductor that is a kind of metal oxide will be described.

The metal oxide preferably contains at least indium or zinc. In particular, indium and zinc are preferably contained. In addition, one or more kinds selected from aluminum, gallium, yttrium, tin, and the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor will be described with reference to FIG. 9A. FIG. 9A is a diagram showing the classification of crystal structures of an oxide semiconductor, typically IGZO (a metal oxide containing In, Ga, and Zn).

As shown in FIG. 9A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 9A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 9B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 9B and obtained by GIXD measurement is hereinafter simply referred to as an XRD spectrum. The CAAC-IGZO film in FIG. 9B has a composition in the vicinity of In:Ga:Zn=4:2:3 [atomic ratio]. The CAAC-IGZO film in FIG. 9B has a thickness of 500 nm.

As shown in FIG. 9B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 9B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 9C shows a diffraction pattern of the CAAC-IGZO film. FIG. 9C shows a diffraction pattern obtained with the NBED method in which an electron beam is incident in the direction parallel to the substrate. The CAAC-IGZO film in FIG. 9C has a composition in the vicinity of In:Ga:Zn=4:2:3 [atomic ratio]. In the nanobeam electron diffraction method, electron diffraction is performed with a probe diameter of 1 nm.

As shown in FIG. 9C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 9A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (4 and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments and the like.

Embodiment 4

In this embodiment, application examples of the above-described semiconductor device will be described.

[Semiconductor Wafer and Chip]

Figure 10A:
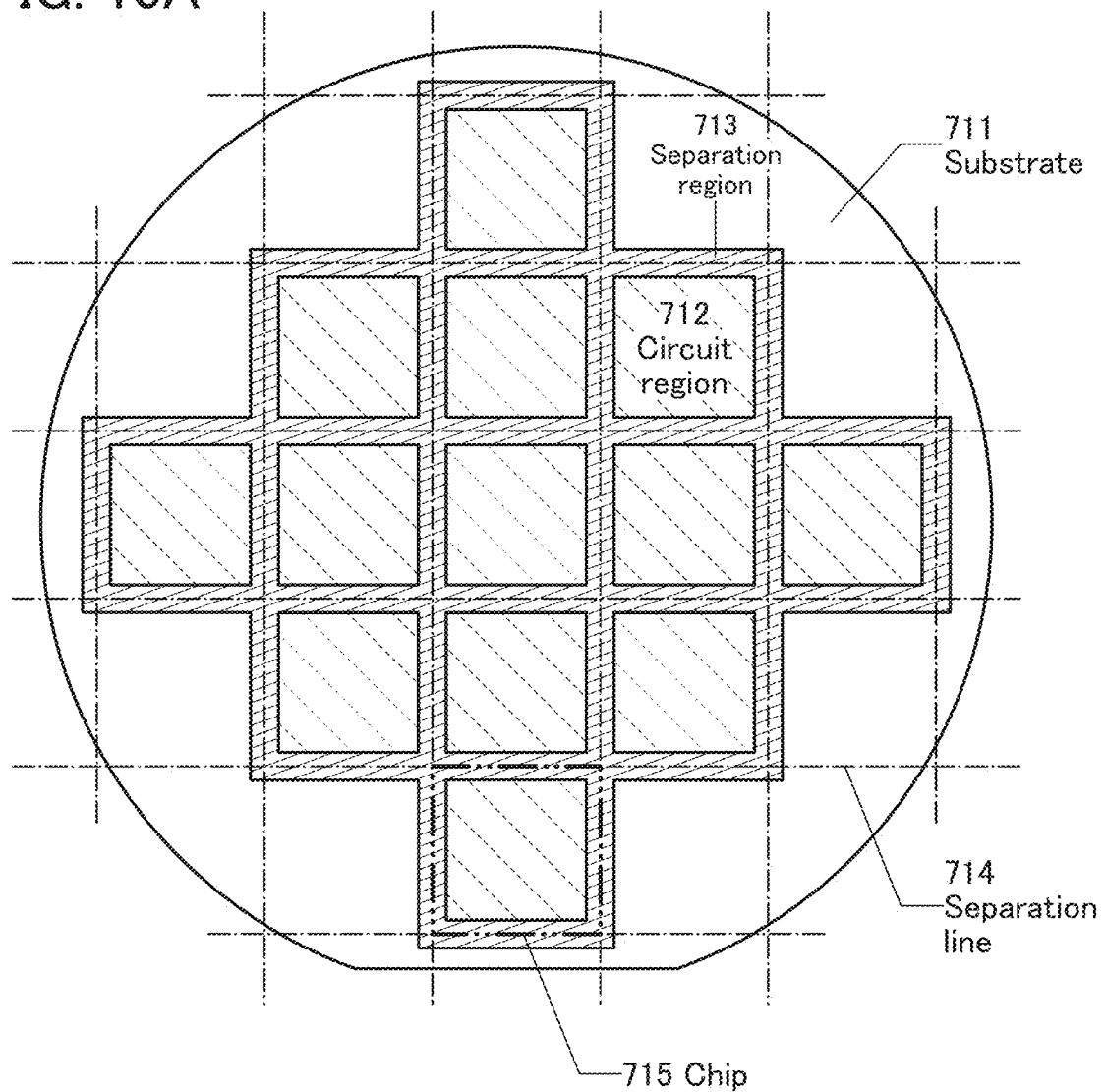
FIG. 10A is a top view of a semiconductor wafer.

FIG. 10A is a top view of a substrate 711 before dicing treatment. As the substrate 711, a semiconductor substrate (also referred to as a semiconductor wafer) can be used, for example. A plurality of circuit regions 712 are provided over the substrate 711. A semiconductor device according to one embodiment of the present invention, a CPU, an RF tag, an image sensor, or the like can be provided in the circuit region 712.

Figure 10B:
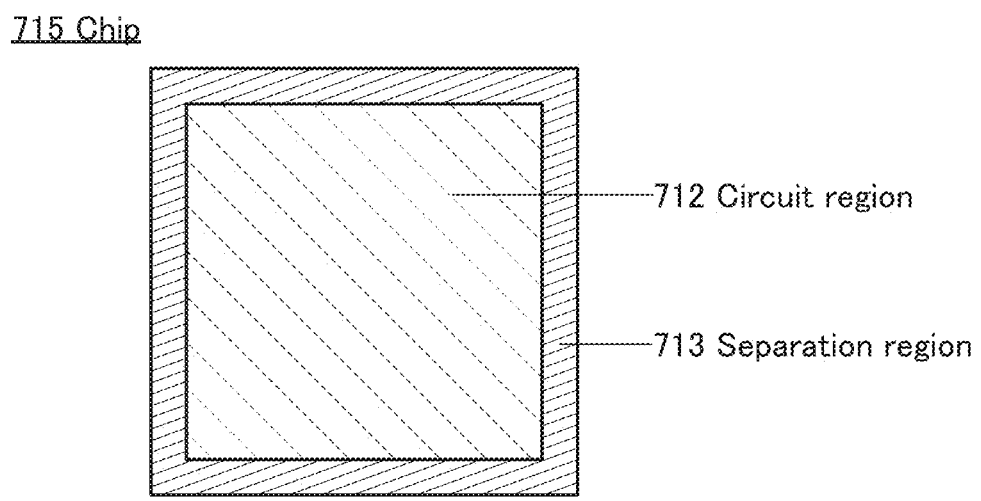
FIG. 10B is a top view of a chip.

The plurality of circuit regions 712 are each surrounded by a separation region 713. Separation lines (also referred to as dicing lines) 714 are set at a position overlapping with the separation regions 713. Chips 715 each including the circuit region 712 can be cut from the substrate 711 by cutting the substrate 711 along the separation lines 714. FIG. 10B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing the semiconductor device can be reduced. Moreover, the semiconductor device can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated electric charge to be released slowly; thus, the rapid move of electric charge due to ESD can be inhibited and electrostatic breakdown is less likely to occur.

[Electronic Component]

Figure 11A:
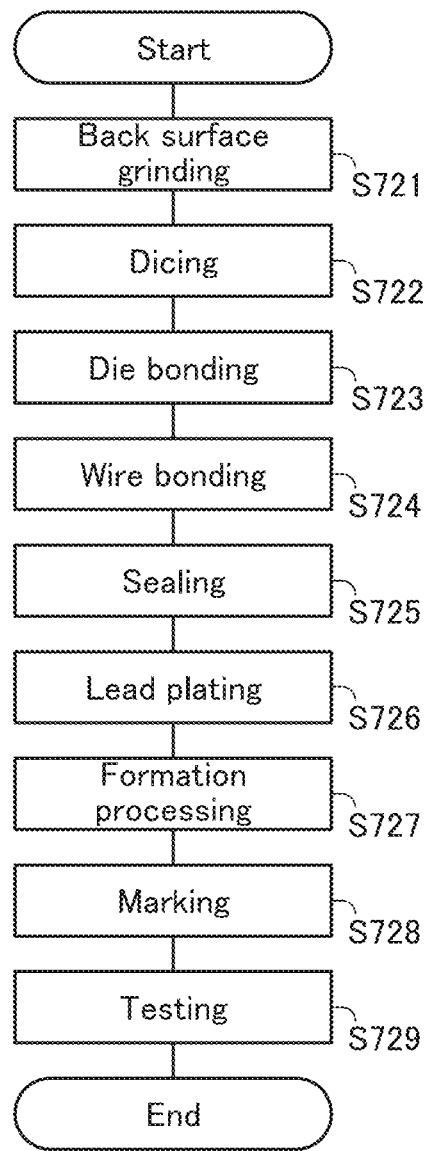
FIG. 11A is a flow chart showing an example of a manufacturing process of an electronic component.
Figure 11B:
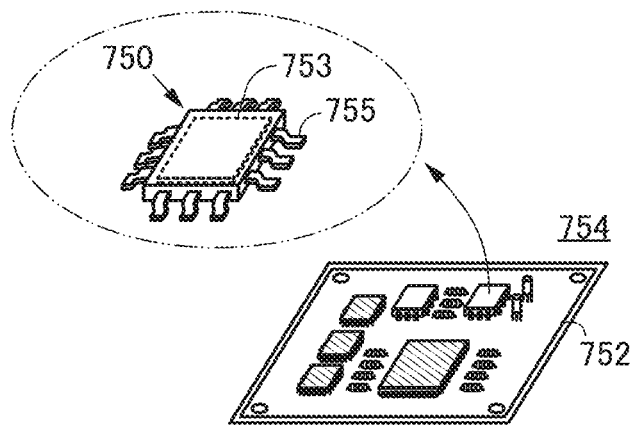
FIG. 11B is a schematic perspective view of the electronic component.

FIG. 11A and FIG. 11B show an example in which the chip 715 is used for an electronic component. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

The post-process is described with reference to a flowchart shown in FIG. 11A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" is performed to divide the element substrate into a plurality of chips (the chips 715) (Step S722). Then, a "die bonding step" is performed to pick up the divided chips separately and bond them onto a lead frame (Step S723). To bond a chip and a lead frame in the die bonding step, resin bonding, tape-automated bonding, or the like is selected as appropriate depending on products. Note that the chip may be bonded to an interposer substrate instead of the lead frame.

Next, a "wire bonding step" is performed to electrically connect a lead of the lead frame and an electrode on the chip through a metal fine line (wire) (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S726). With the plating process, rust of the lead can be prevented, and soldering for mounting the electronic component on a printed circuit board in a later step can be performed more surely. Then, a "formation step" is performed to cut and process the lead (Step S727).

Next, a "marking step" in which printing (marking) is performed on a surface of the package is conducted (Step S728). After a "testing step" (Step S729) for checking whether an external shape is good and whether there is a malfunction, for example, the electronic component is completed.

FIG. 11B is a schematic perspective view of the completed electronic component. FIG. 11B is a schematic perspective view of a QFP (Quad Flat Package) as an example of the electronic component. An electronic component 750 illustrated in FIG. 11B includes a lead 755 and a semiconductor device 753. As the semiconductor device 753, the semiconductor device described in any of the above embodiments can be used, for instance.

The electronic component 750 illustrated in FIG. 11B is, for example, mounted on a printed circuit board 752. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Next, examples of electronic devices each including the semiconductor device according to one embodiment of the present invention or the above-described electronic component will be described with reference to FIG. 12 and FIG. 13A to FIG. 13F.

Examples of electronic devices that can be provided with the semiconductor device or the electronic component according to one embodiment of the present invention include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pachinko machines, calculators, mobile information terminals (portable information terminals), electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling power supply and smart grid.

In addition, moving objects and the like driven by electric motors using power from power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

The semiconductor device or the electronic component according to one embodiment of the present invention can be suitably used for a communication device or part of a communication device incorporated in the electronic devices, for example. Alternatively, the semiconductor device according to one embodiment of the present invention or the electronic component can be used as an amplifier device of a high-frequency signal that is incorporated in the electronic devices.

Figure 12:
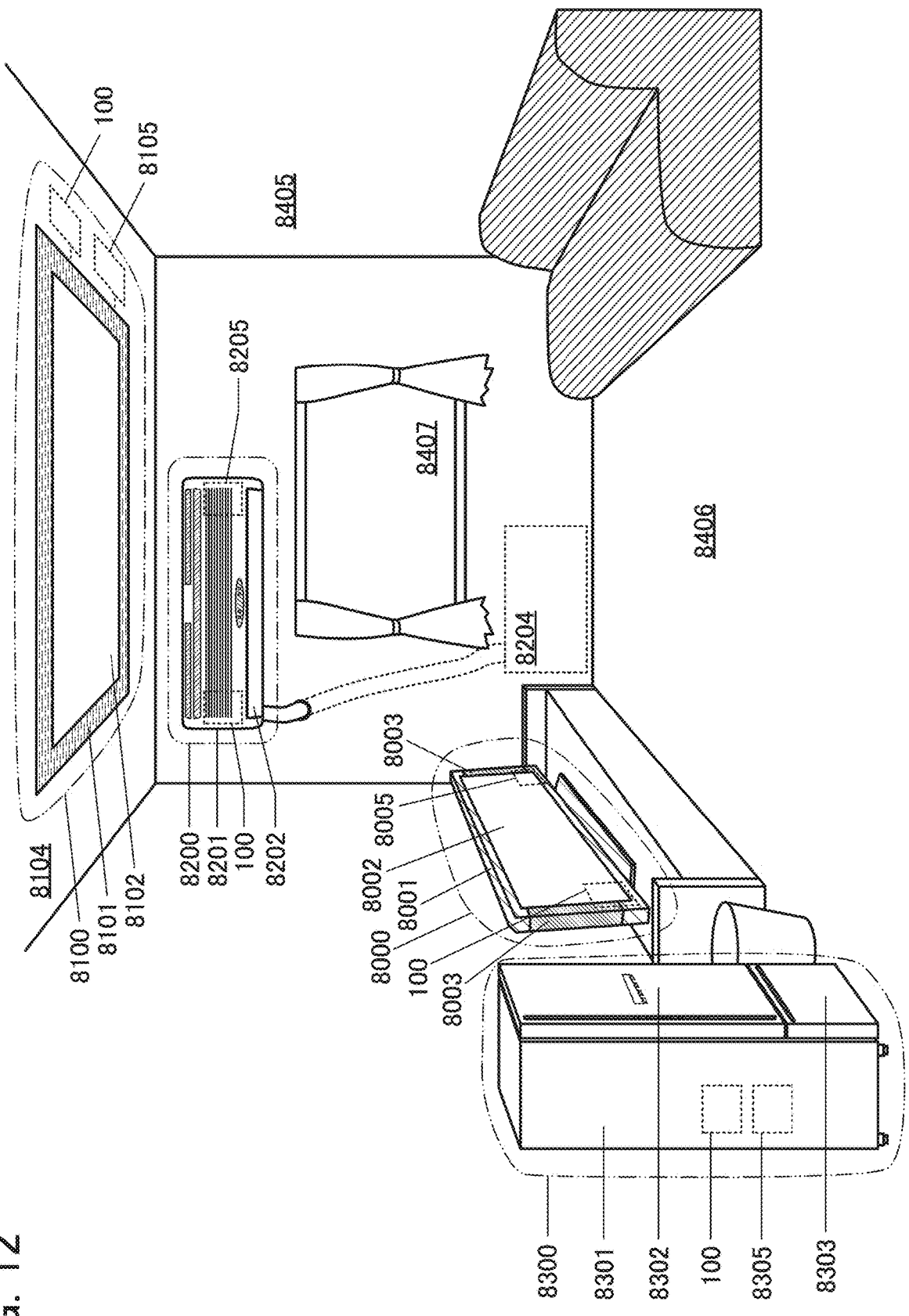
FIG. 12 is a diagram illustrating examples of electronic devices.

FIG. 12 and FIG. 13A to FIG. 13F illustrate examples of electronic devices. In FIG. 12, a display device 8000 is an example of an electronic device including the semiconductor device 100 according to one embodiment of the present invention. Specifically, the display device 8000 corresponds to a display device for TV broadcast reception and includes a housing 8001, a display portion 8002, speaker portions 8003, the semiconductor device 100, a power storage device 8005, and the like. The semiconductor device 100 according to one embodiment of the present invention is provided in the housing 8001. With the semiconductor device 100, the display device 8000 can have a communication function, and the display device 8000 can function as an IoT device.

The display device 8000 can receive power from a commercial power supply. Alternatively, the display device 8000 can use power stored in the power storage device 8005. The display portion 8002 can include various display devices such as liquid crystal display devices, light-emitting display devices in which a light-emitting element, e.g., an organic EL element, is provided in each pixel, electrophoretic display devices, DMDs (Digital Micromirror Devices), PDPs (Plasma Display Panels), and FEDs (Field Emission Displays).

Note that the display device includes, in its category, all of information display devices for personal computers, advertisement display, and the like besides for TV broadcast reception.

In FIG. 12, an installation lighting device 8100 is an example of an electronic device including the semiconductor device 100 according to one embodiment of the present invention. Specifically, the lighting device 8100 includes a housing 8101, a light source 8102, the semiconductor device 100, a power storage device 8105, and the like. Although FIG. 12 illustrates an example of the case where the semiconductor device 100 is provided in a ceiling 8104 on which the housing 8101 and the light source 8102 are installed, the semiconductor device 100 may be provided in the housing 8101. With the semiconductor device 100, the lighting device 8100 can have a communication function, and the lighting device 8100 can function as an IoT device.

The lighting device 8100 can receive power from a commercial power supply. Alternatively, the lighting device 8100 can use power stored in the power storage device 8105. As the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

Note that although FIG. 12 illustrates the installation lighting device 8100 provided in the ceiling 8104 as an example, the semiconductor device 100 according to one embodiment of the present invention can be used in an installation lighting device provided in, for example, a wall 8405, a floor 8406, a window 8407, or the like other than the ceiling 8104. Alternatively, the semiconductor device 100 according to one embodiment of the present invention can be used in a tabletop lighting device or the like.

In FIG. 12, an air conditioner including an indoor unit 8200 and an outdoor unit 8204 is an example of an electronic device including the semiconductor device 100 according to one embodiment of the present invention. Specifically, the indoor unit 8200 includes a housing 8201, an air outlet 8202, the semiconductor device 100, a power storage device 8205, and the like. Although FIG. 12 illustrates an example of the case where the semiconductor device 100 is provided in the indoor unit 8200, the semiconductor device 100 may be provided in the outdoor unit 8204. Alternatively, the semiconductor devices 100 may be provided in both the indoor unit 8200 and the outdoor unit 8204. With the semiconductor device 100, the air conditioner including the indoor unit 8200 and the outdoor unit 8204 can have a communication function, and the air conditioner can function as an IoT device.

The air conditioner can receive power from a commercial power supply. Alternatively, the air conditioner can use power stored in the power storage device 8205. Note that although FIG. 12 illustrates the split-type air conditioner including the indoor unit and the outdoor unit as an example, the semiconductor device 100 according to one embodiment of the present invention can be used in an air conditioner in which the functions of an indoor unit and an outdoor unit are integrated in one housing.

In FIG. 12, an electric refrigerator-freezer 8300 is an example of an electronic device including the semiconductor device 100 according to one embodiment of the present invention. Specifically, the electric refrigerator-freezer 8300 includes a housing 8301, a refrigerator door 8302, a freezer door 8303, the semiconductor device 100, a power storage device 8305, and the like. With the semiconductor device 100, the electric refrigerator-freezer 8300 can have a communication function, and the electric refrigerator-freezer 8300 can function as an IoT device.

In FIG. 12, the power storage device 8305 is provided in the housing 8301. The electric refrigerator-freezer 8300 can receive power from a commercial power supply. Alternatively, the electric refrigerator-freezer 8300 can use power stored in the power storage device 8305.

Figure 13A:
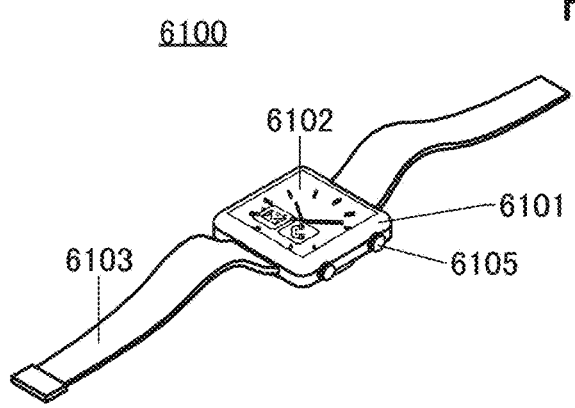
FIG. 13A to FIG. 13F are diagrams illustrating examples of electronic devices.

FIG. 13A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device or the electronic component according to one embodiment of the present invention. For example, when the portable information terminal 6100 includes the semiconductor device 100, the portable information terminal 6100 can function as an IoT device.

Figure 13B:
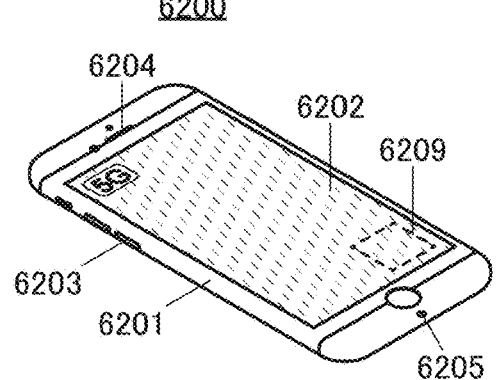

FIG. 13B illustrates an example of a portable information terminal that has a function of a cellular phone. A portable information terminal 6200 includes a display portion 6202 incorporated in a housing 6201, operation buttons 6203, a speaker 6204, a microphone 6205, and the like. The portable information terminal 6200 includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device or the electronic component according to one embodiment of the present invention. For example, when the portable information terminal 6200 includes the semiconductor device 100, the portable information terminal 6200 can function as an IoT device.

Figure 13C:
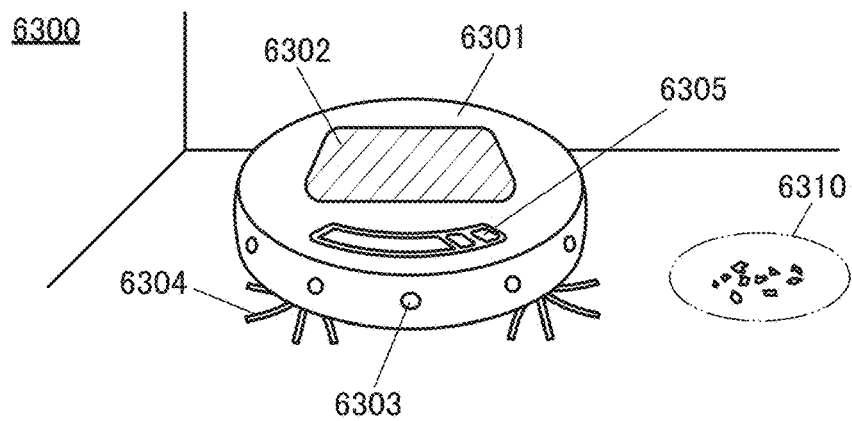

FIG. 13C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 further includes a secondary battery and the semiconductor device or the electronic component according to one embodiment of the present invention. For example, when the cleaning robot 6300 includes the semiconductor device 100, the cleaning robot 6300 can function as an IoT device.

Figure 13D:
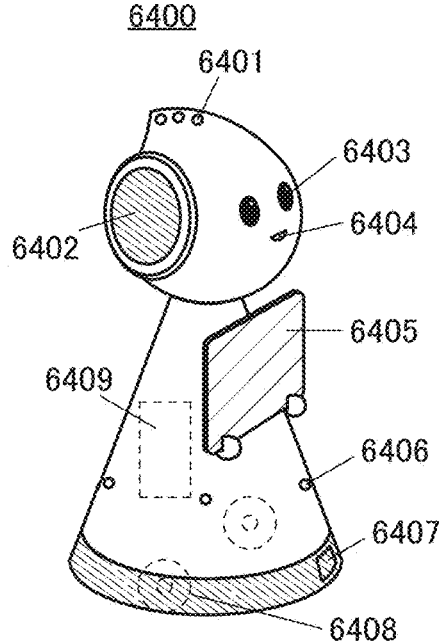

FIG. 13D illustrates an example of a robot. A robot 6400 illustrated in FIG. 13D includes an arithmetic device 6409, an illuminance sensor 6401, a microphone 6402, an upper camera 6403, a speaker 6404, a display portion 6405, a lower camera 6406, an obstacle sensor 6407, a moving mechanism 6408, and the like.

The microphone 6402 has a function of detecting a speaking voice of a user, an environmental sound, and the like. The speaker 6404 has a function of outputting sound. The robot 6400 can communicate with a user with the use of the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407.

The robot 6400 further includes a secondary battery and the semiconductor device or the electronic component according to one embodiment of the present invention. For example, when the robot 6400 includes the semiconductor device 100, the robot 6400 can function as an IoT device.

Figure 13E:
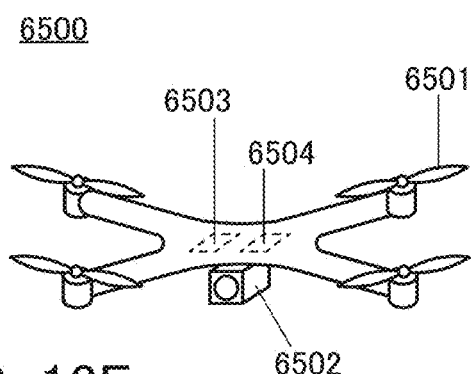

FIG. 13E illustrates an example of a flying object. A flying object 6500 illustrated in FIG. 13E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there are obstacles when the flying object moves.

Moreover, the electronic component 6504 can estimate the remaining battery level from a change in the power storage capacity of the battery 6503.

The flying object 6500 further includes the semiconductor device or the electronic component according to one embodiment of the present invention. For example, when the flying object 6500 includes the semiconductor device 100, the flying object 6500 can function as an IoT device.

Figure 13F:
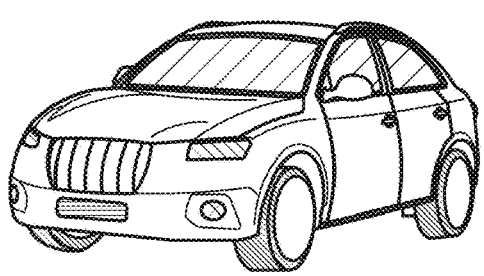

FIG. 13F illustrates an example of an automobile. An automobile 7160 includes an engine, tires, a brake, a steering gear, a camera, and the like. The automobile 7160 includes the semiconductor device or the electronic component according to one embodiment of the present invention. For example, when the automobile 7160 includes the semiconductor device 100, the automobile 7160 can function as an IoT device.

The composition, structure, method, and the like described in this embodiment can be used in combination as appropriate with the compositions, structures, methods, and the like described in the other embodiments and the like.

Embodiment 5

The use of the OS transistor described in this specification and the like enables a normally-off CPU (also referred to as Noff-CPU) to be obtained. In this embodiment, an Noff-CPU, an IoT (Internet of Things) end device (also referred to as an endpoint microcomputer), and the semiconductor device according to one embodiment of the present invention will be described.

The Noff-CPU is an integrated circuit including a normally-off transistor, which is in a non-conduction state (also referred to as off state) even when a gate voltage is 0 V. In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized.

The Noff-CPU can hold data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

Figure 14:
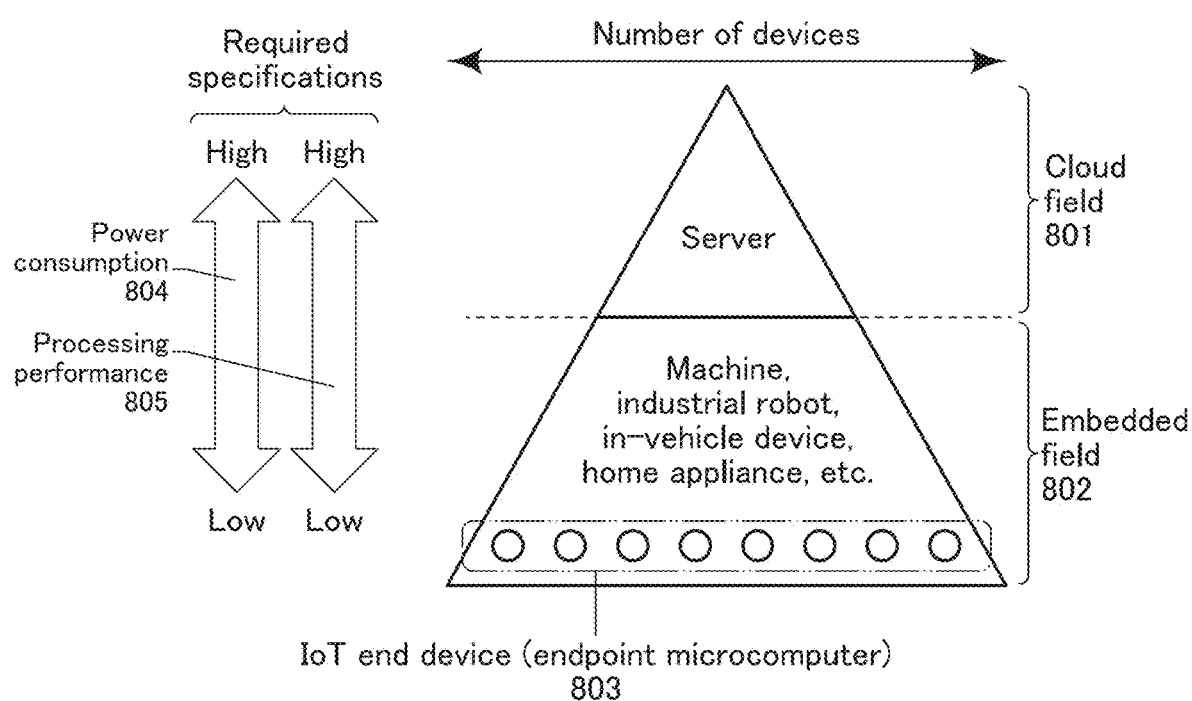
FIG. 14 is a diagram illustrating a hierarchical structure of an IoT network and tendencies of required specifications.

The Noff-CPU can be used for, for example, a small-scale system such as an IoT end device 803 in the IoT field (see FIG. 14).

FIG. 14 shows a hierarchical structure of an IoT network and tendencies of required specifications. FIG. 14 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC (System on a Chip), and the like are used in the cloud field 801. Furthermore, at the lower level, lower power consumption is required rather than higher processing performance, and the number of devices is explosively increased. The semiconductor device according to one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 15:
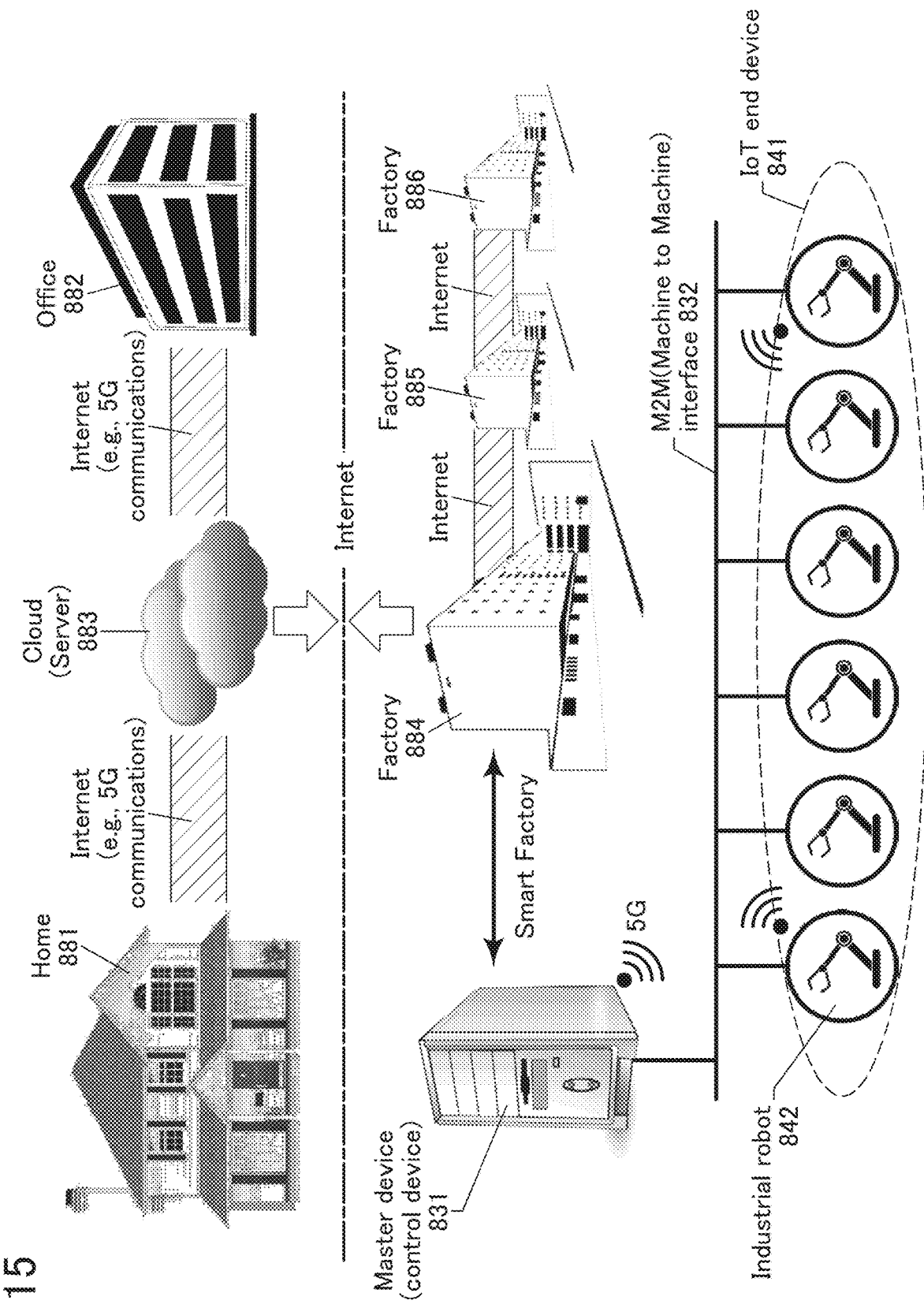
FIG. 15 is a conceptual diagram of factory automation.

FIG. 15 is a conceptual diagram of factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device according to one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through a M2M (Machine-to-Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff-CPU. Although the embedded field of IoT sometimes requires quick response, the use of the Noff-CPU achieves high-speed return from a standby state.

The composition, structure, method, and the like described in this embodiment can be used in combination as appropriate with the compositions, structures, methods, and the like described in the other embodiments and the like.

Example

In this example, a transistor that can be used as the transistor T21 included in the envelope detection circuit 20 was fabricated, and the electrical characteristics of the fabricated transistor were measured. The fabricated transistor is an OS transistor and includes a top gate and a back gate. Furthermore, the fabricated transistor has a channel length (denoted as "L" in FIG. 18B and FIG. 19A) of 13 nm, a channel width (denoted as "W" in FIG. 18B and FIG. 19A) of 26 nm, and excellent high-frequency characteristics.

Figure 16A:
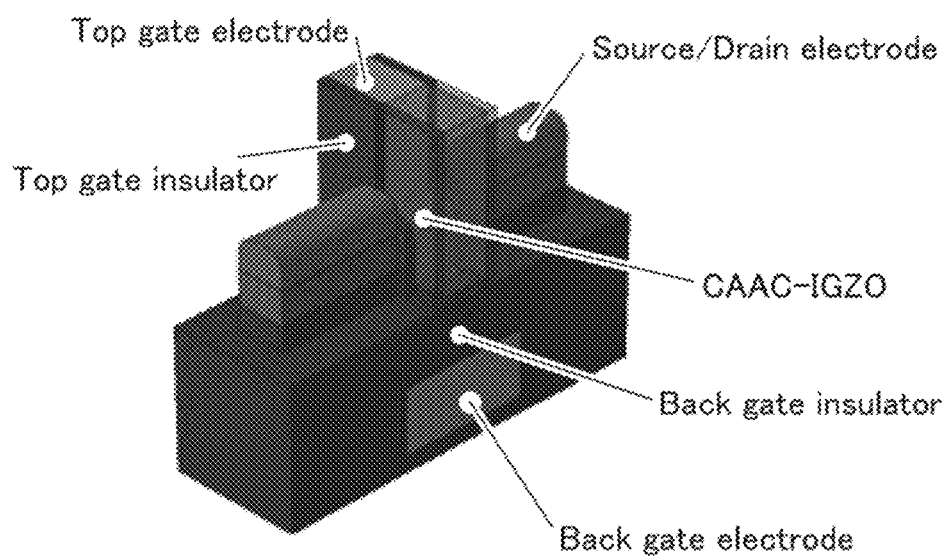
FIG. 16A is a schematic view illustrating the structure of a fabricated transistor.

FIG. 16A is a schematic view illustrating a structure of the fabricated transistor. The transistor has a structure similar to that of the transistor 500 described in the above embodiment and includes a top gate electrode (Top gate electrode), a gate insulating layer on the top gate electrode side (Top gate insulator), a back gate electrode (Back gate electrode), a gate insulating layer on the back gate electrode side (Back gate insulator), an electrode functioning as a source or a drain (Source/Drain electrode), and the like. In addition, the transistor includes an In—Ga—Zn oxide (CAAC-IGZO) having a CAAC structure in its channel formation region.

Figure 16B:
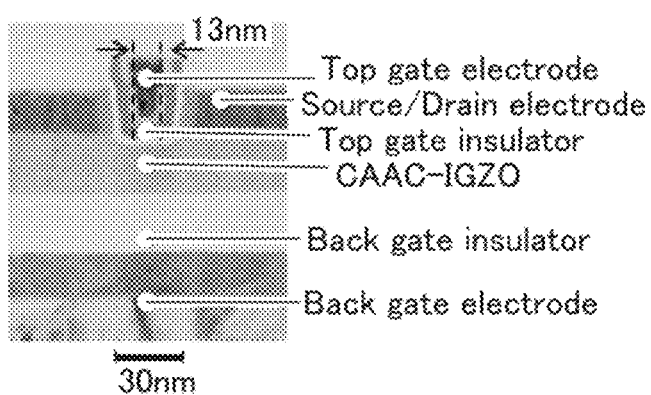
FIG. 16B is a cross-sectional view in the channel length direction.

FIG. 16B is a cross-sectional view of the fabricated transistor in the channel length direction. FIG. 17A is a cross-sectional view of the fabricated transistor in the channel width direction.

FIG. 17B and FIG. 17C are top gate voltage (denoted as "$V_{gs}$" in the diagram)-drain current (denoted as "Id" in the diagram) characteristics of the fabricated transistor.

FIG. 17B shows the measurement results of the top gate voltage-drain current characteristics; the measurement was performed every 2 V from +6 V to −6 V of the back gate voltage with respect to the source (denoted as "$V_{bs}$" in the diagram) when the drain voltage with respect to the source (denoted as "$V_{ds}$" in the diagram) was 0.9 V and the measurement environment temperature (denoted as "Temp." in the diagram) was 27° C. The state in which the threshold voltage of the fabricated transistor increases or decreases in accordance with the back gate voltage with respect to the source can be observed.

FIG. 17C shows the measurement results of the top gate voltage-drain current characteristics under the conditions where the drain voltage with respect to the source was 0.9 V, the back gate voltage with respect to the source was 0.0 V, and the measurement environment temperature was −40° C., 27° C., 85° C., and 150° C. The state can be observed in which the on-state current of the fabricated transistor does not decrease even at a high measurement environment temperature. Moreover, transconductance (denoted as "$g_m$" in the diagram) is also shown in FIG. 17C.

Figure 18A:
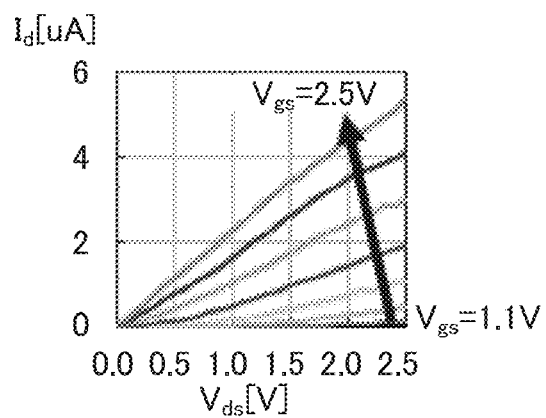
FIG. 18A is drain voltage with respect to the source-drain current characteristics of the fabricated transistor.

FIG. 18A is drain voltage with respect to the source-drain current characteristics of the fabricated transistor. FIG. 18A shows the results of the drain voltage with respect to the source-drain current characteristics measured every 0.2 V from 1.1 V to 2.5 V of the top gate voltage.

Figure 18B:
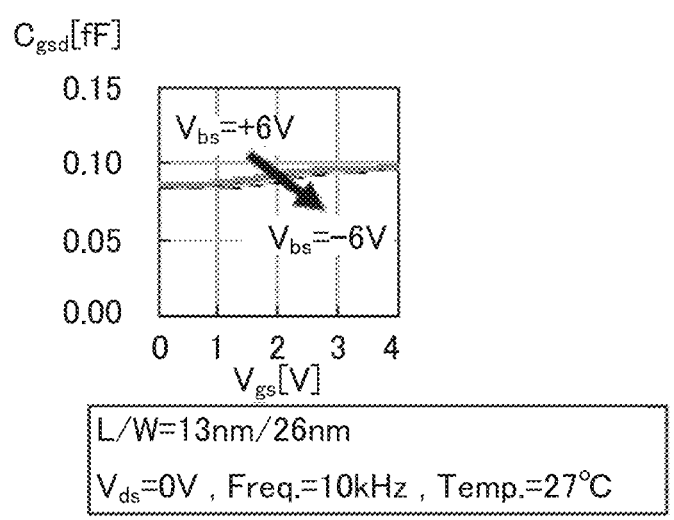
FIG. 18B is top gate voltage-gate capacitance characteristics of the fabricated transistor.

FIG. 18B is top gate voltage-gate capacitance (denoted as "$C_{gsd}$" in the diagram) characteristics of the fabricated transistor. FIG. 18B shows the measurement results of the top gate voltage-gate capacitance characteristics; the measurement was performed with the back gate voltage with respect to the source changed from +6 V to −6 V when the drain voltage with respect to the source was 0.0 V, the measurement frequency (denoted as "Freq." in the diagram) was 10 kHz, and the measurement environment temperature was 27° C.

Figure 19A:
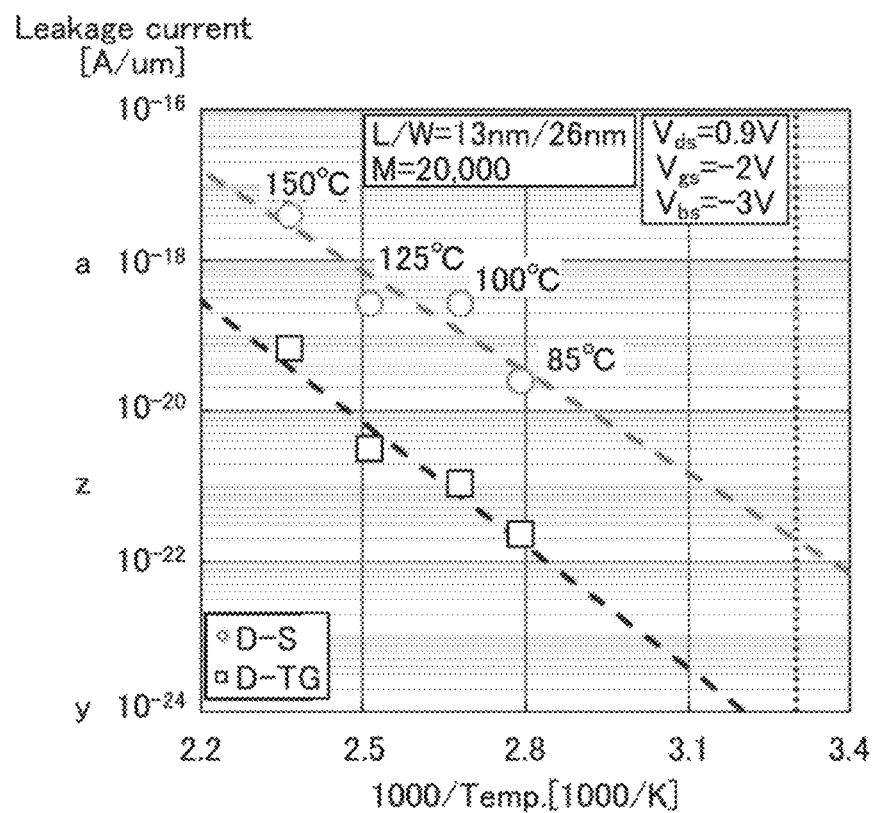
FIG. 19A is measurement environment temperature-leakage current characteristics of the fabricated transistor.

FIG. 19A is measurement environment temperature-leakage current (denoted as "Leakage current" in the diagram) characteristics of the fabricated transistor. FIG. 19A shows the measurement results of the measurement environment temperature-leakage current characteristics under the conditions where the drain voltage with respect to the source was 0.9 V, the top gate voltage was −2 V, the back gate voltage with respect to the source was −3 V, and the measurement environment temperature was 85° C., 100° C., 125° C., and 150° C. The measurement was performed on 20,000 transistors connected in parallel (denoted as "M=20,000" in the diagram).

In FIG. 19A, the measurement results of the transistor fabricated in this example are represented by a symbol with "D-S" in the diagram and compared with the previous measurement results in Non-Patent Document 3 (which are represented by a symbol with "D-TG" in the diagram). The leakage current of the transistor fabricated in this example was higher than that in the measurement results in Non-Patent Document 3 but lower than that of a Si transistor.

Figure 19B:
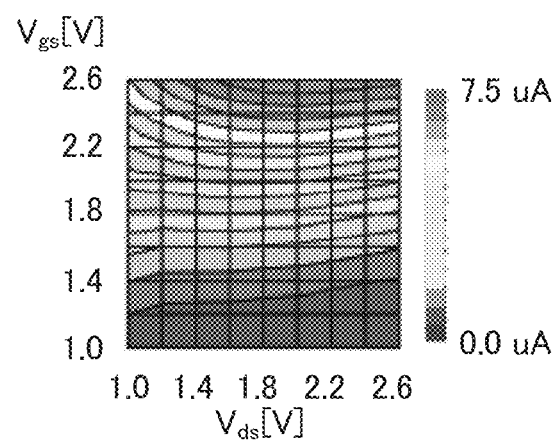
FIG. 19B is a diagram two-dimensionally showing drain current characteristics of the fabricated transistor.

FIG. 19B is a diagram two-dimensionally showing drain current characteristics of the fabricated transistor with respect to the drain voltage with respect to the source and the top gate voltage. FIG. 19B shows the drain current characteristics in the range of the drain voltage with respect to the source from 1.0 V to 2.6 V and in the range of the top gate voltage from 1.0 V to 2.6 V.

Figure 20A:
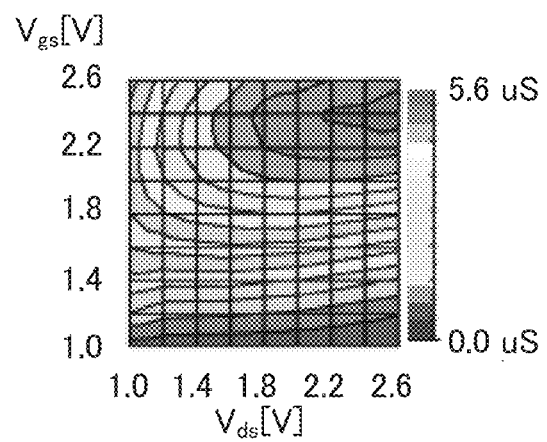
FIG. 20A is a diagram two-dimensionally showing transconductance of the fabricated transistor.
Figure 20B:
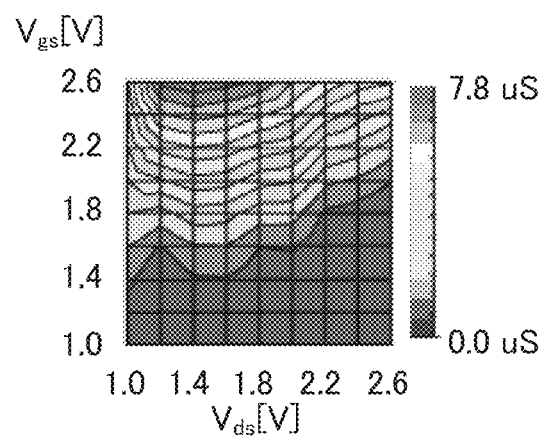
FIG. 20B is a diagram two-dimensionally showing drain conductance of the fabricated transistor.

FIG. 20A and FIG. 20B are diagrams two-dimensionally showing transconductance of the fabricated transistor and drain conductance of the fabricated transistor, respectively, with respect to the drain voltage with respect to the source and the top gate voltage. The ranges of the drain voltage with respect to the source and the top gate voltage in FIG. 20A and FIG. 20B are the same as those in FIG. 19B.

Figure 21A:
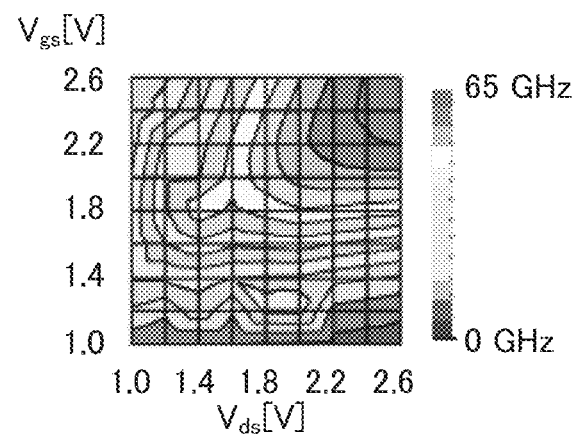
FIG. 21A is a diagram two-dimensionally showing cutoff frequency of the fabricated transistor.
Figure 21B:
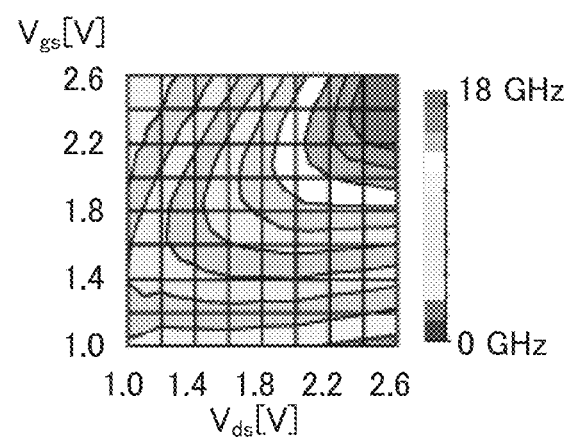
FIG. 21B is a diagram two-dimensionally showing maximum oscillation frequency of the fabricated transistor.

FIG. 21A and FIG. 21B are diagrams two-dimensionally showing cutoff frequency of the fabricated transistor and maximum oscillation frequency of the fabricated transistor, respectively, with respect to the drain voltage with respect to the source and the top gate voltage. The ranges of the drain voltage with respect to the source and the top gate voltage in FIG. 21A and FIG. 21B are the same as those in FIG. 19B.

Figure 22A:
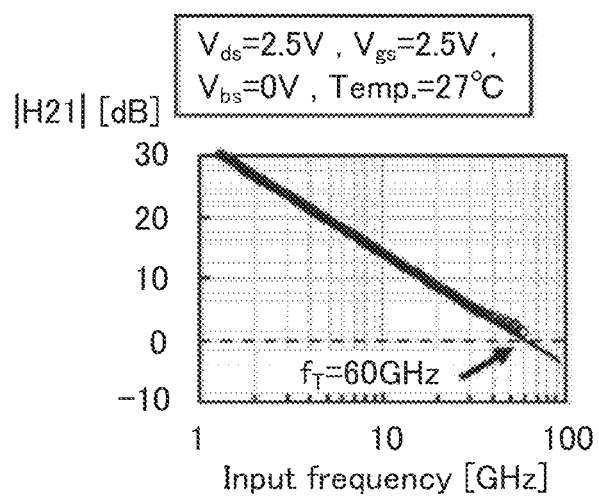
FIG. 22A is a diagram showing maximum current gain of the fabricated transistor.

FIG. 22A is a diagram showing maximum current gain of the fabricated transistor. FIG. 22A shows the measurement results of current gain with respect to input frequency (denoted as "Input frequency" in the diagram) under the conditions where the drain voltage with respect to the source was 2.5 V, the top gate voltage was 2.5 V, the back gate voltage with respect to the source was 0 V, and the measurement environment temperature was 27° C. FIG. 22A shows that the cutoff frequency (denoted as "$f_T$" in the diagram) is 60 GHz.

Figure 22B:
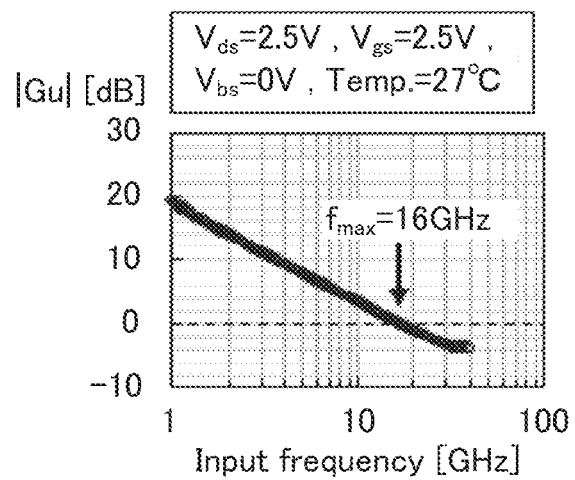
FIG. 22B is a diagram showing maximum unilateral gain of the fabricated transistor.

FIG. 22B is a diagram showing maximum unilateral gain of the fabricated transistor. FIG. 22B shows the measurement results of unilateral gain with respect to input frequency under the conditions where the drain voltage with respect to the source was 2.5 V, the top gate voltage was 2.5 V, the back gate voltage with respect to the source was 0 V, and the measurement environment temperature was 27° C. FIG. 22B shows that the maximum oscillation frequency (denoted as "$f_{max}$" in the diagram) is 16 GHz.

Figure 23A:
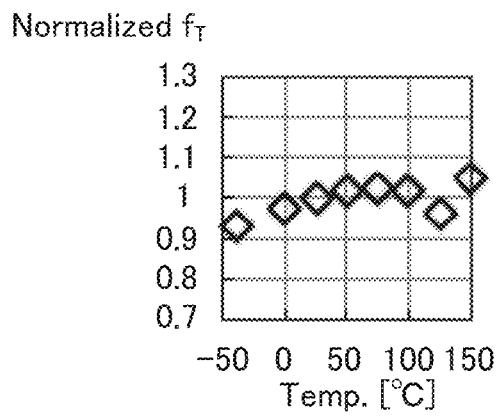
FIG. 23A is measurement environment temperature-normalized cutoff frequency characteristics of the fabricated transistor.

FIG. 23A is measurement environment temperature-normalized cutoff frequency (denoted as "Normalized $f_T$" in the diagram) characteristics of the fabricated transistor.

Figure 23B:
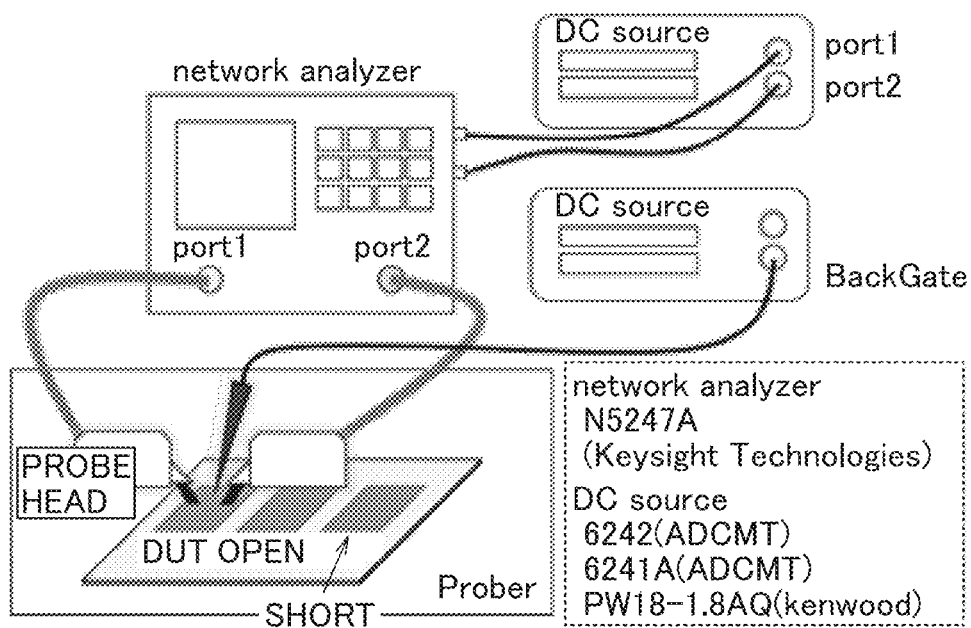
FIG. 23B is a diagram illustrating an environment for measuring electrical characteristics of the fabricated transistor.

FIG. 23B is a diagram illustrating an environment for measuring electrical characteristics of the fabricated transistor in this example. The electrical characteristics were measured using a power supply device (denoted as "DC source" in the diagram), a network analyzer (denoted as "network analyzer" in the diagram), and a prober (denoted as "Prober" in the diagram); 6242 (manufactured by ADCMT), 6241A (manufactured by ADCMT), and/or PW18-1.8AQ (manufactured by kenwood) were/was used as the power supply device; and N5247A (manufactured by Keysight Technologies) was used as the network analyzer.

A substrate including a measurement target (denoted as "DUT" in the diagram) was provided over the prober, and with the use of a probe head (denoted as "PROBE HEAD" in the diagram), voltage was applied to the top gate, the drain, the source, and the back gate, or current was measured. For example, FIG. 23B illustrates the state where voltage applied to the back gate (denoted as "BackGate" in the diagram) is generated using the power supply device, and the voltage is applied to the top gate, the drain, or the source through a port 1 and a port 2 (denoted as "port1" and "port2" in the diagram) of the measurement targets. In addition, a TEG (Test Element Group) for open correction (denoted as "OPEN" in the diagram) and short correction (denoted as "SHORT" in the diagram) is included in the substrate including the measurement target.

Figures 24A, 24B:
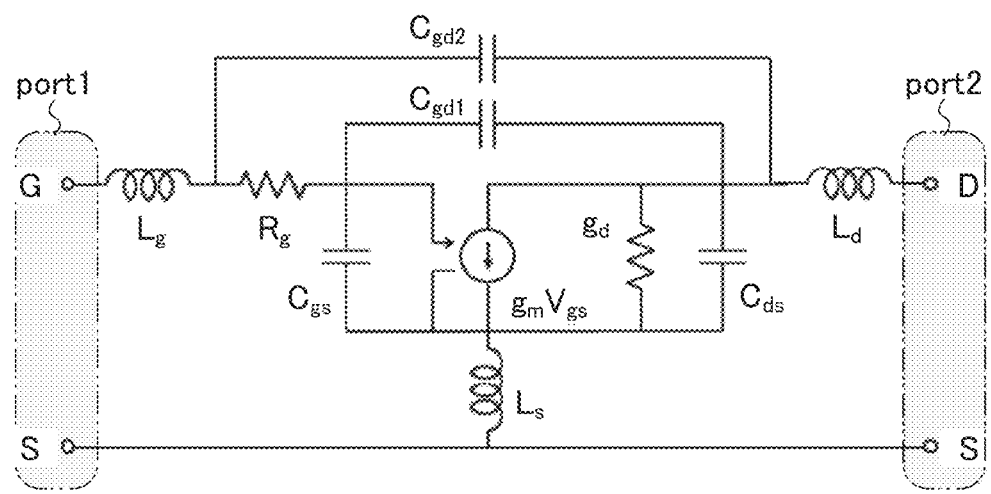
FIG. 24A is a circuit diagram illustrating a small-signal equivalent circuit of the fabricated transistor.
FIG. 24B is a diagram showing results of extracted parameters of the small-signal equivalent circuit.

Moreover, a small-signal equivalent circuit of the fabricated transistor was examined. FIG. 24A is a circuit diagram illustrating the small-signal equivalent circuit of the fabricated transistor. As illustrated in FIG. 24A, a capacitor $C_{gs}$, a capacitor $C_{gd1}$, a capacitor $C_{gd2}$, a capacitor $C_{ds}$, transconductance $g_m$, drain conductance $g_d$, a resistor $R_g$, an inductance La, an inductance $L_s$, and an inductance $L_g$ are used to express the fabricated transistor.

Figure 25:
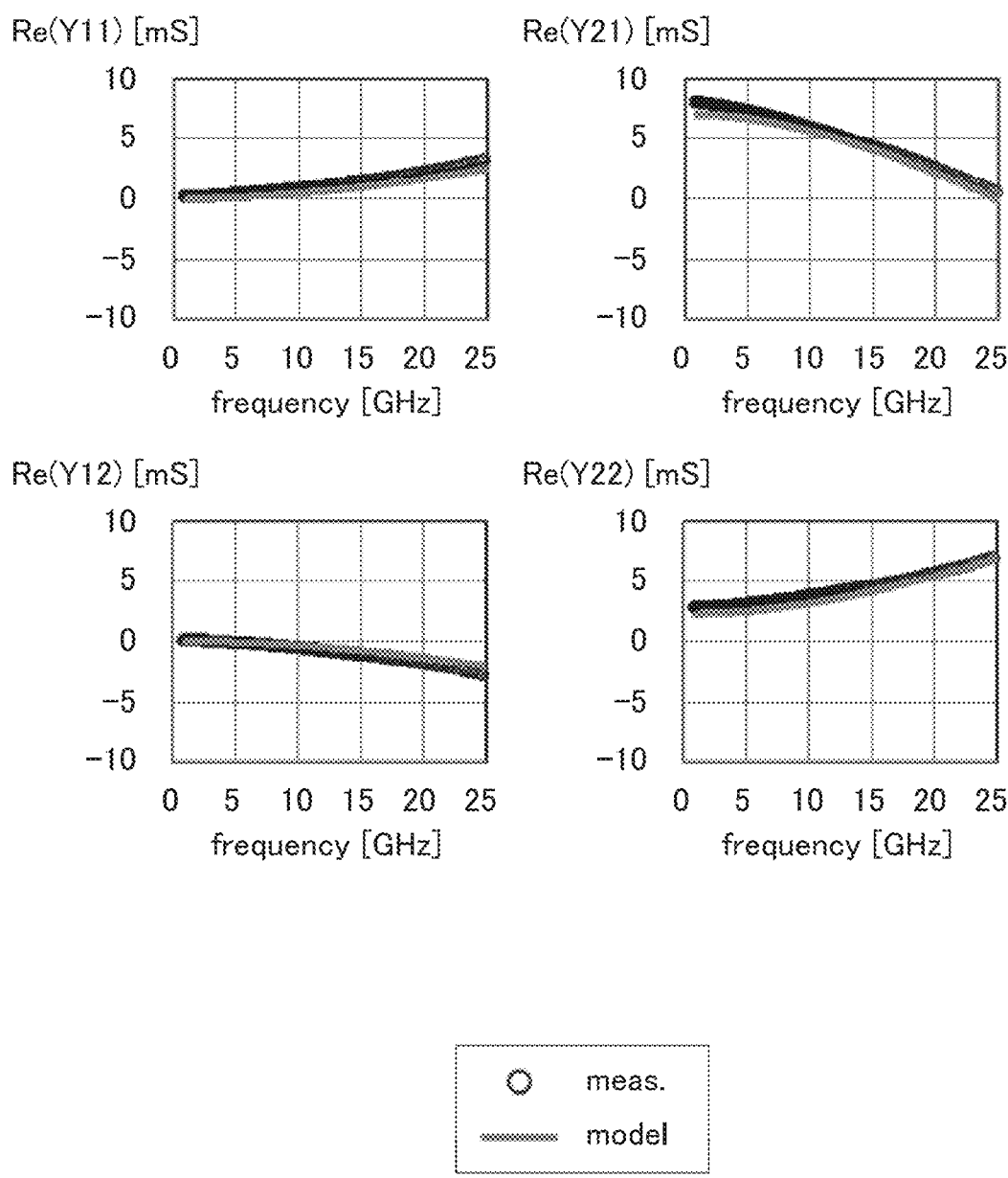
FIG. 25 is a diagram showing comparison of measurement results with calculation results from the small-signal equivalent circuit.
Figure 26:
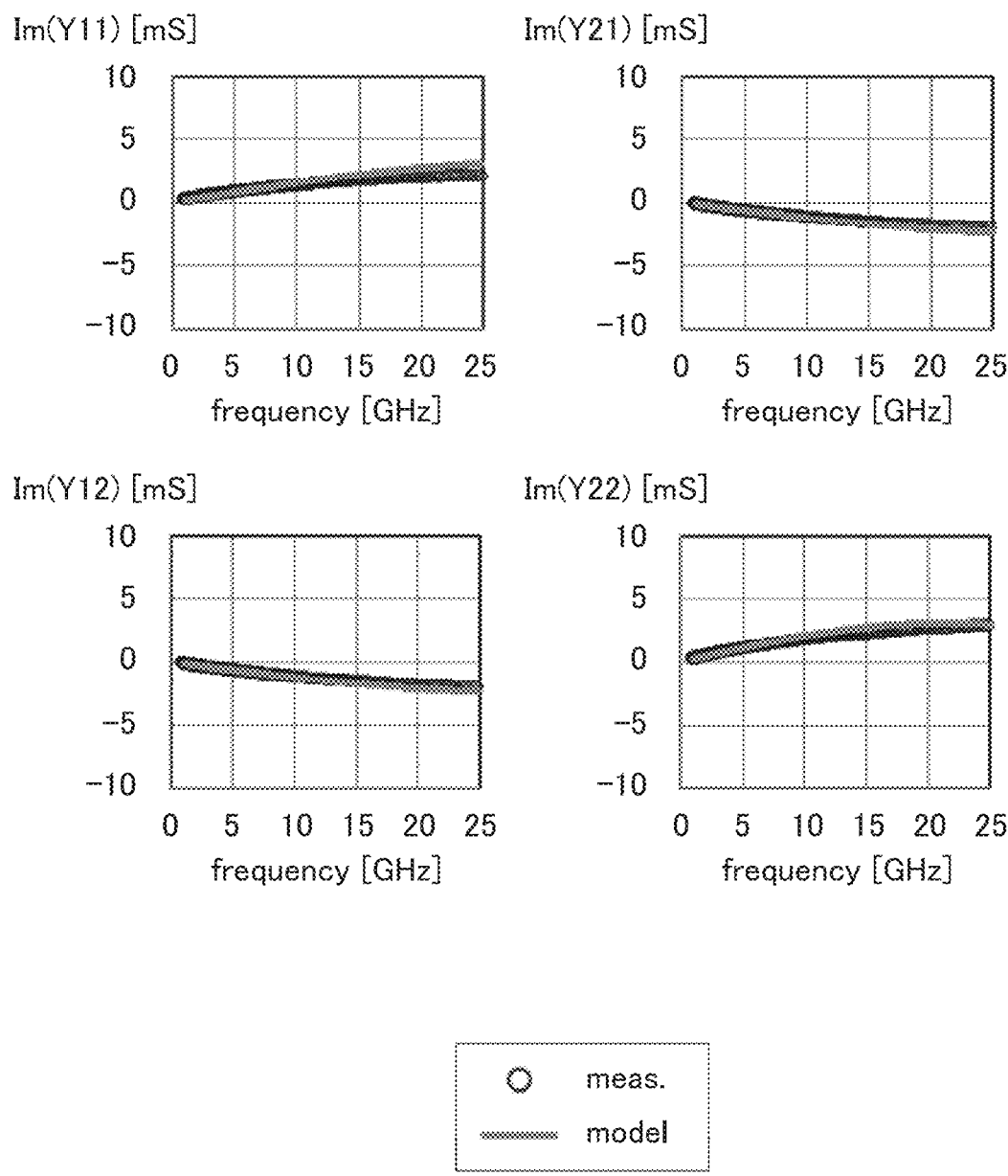
FIG. 26 is a diagram showing comparison of measurement results with calculation results from the small-signal equivalent circuit.

FIG. 24B is a diagram showing results of extracted parameters of the small-signal equivalent circuit. FIG. 25 and FIG. 26 are diagrams showing comparison of measurement results (denoted as "meas." in the diagram) with calculation results using the extracted parameters of the small-signal equivalent circuit (denoted as "model" in the diagram). FIG. 25 shows comparison of real parts of Y11, Y12, Y21, and Y22 with respect to the frequency (denoted as "frequency" in the diagram), and FIG. 26 shows comparison of imaginary parts of Y11, Y12, Y21, and Y22 with respect to the frequency. Note that in the diagrams, for example, the real part of Y11 is denoted as "Re(Y11)" and the imaginary part of Y11 is denoted as "Im(Y11)". FIG. 25 and FIG. 26 show that high frequency circuit design is possible using the small-signal equivalent circuit illustrated in FIG. 24A.

The composition, structure, method, and the like described in this example can be used in combination as appropriate with the compositions, structures, methods, and the like described in the other embodiments and the like.

REFERENCE NUMERALS

C21: capacitor, IN: input terminal, N11: node, N12: node, N13: node, N14: node, N15: node, N16: node, N17: node, OUT: output terminal, REF_IN: input terminal, R21: resistor, R51: resistor, R52: resistor, R53: resistor, R54: resistor, R55: resistor, SII_IN: input terminal, SIO_OUT: output terminal, T21: transistor, VN11: potential, VN12: potential, VN13: potential, VN14: potential, VN15: potential, VN16: potential, VN17: potential, VREF: potential, VSIO: potential, 10: high frequency amplifier circuit, 20: envelope detection circuit, 30: power supply circuit, 40: comparator, 45: smoothing circuit, 50: adder circuit, 51: operational amplifier, 52: operational amplifier, 100: semiconductor device, 110: semiconductor device, 120: semiconductor device, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 711: substrate, 712: circuit region, 713: separation region, 714: separation line, 715: chip, 750: electronic component, 752: printed circuit board, 753: semiconductor device, 754: circuit board, 755: lead, 801: cloud field, 802: embedded field, 803: IoT end device, 804: power consumption, 805: processing performance, 831: master device, 832: M2M interface, 841: IoT end device, 842: industrial robot, 881: home, 882: office, 883: cloud, 884: factory, 885: factory, 886: factory, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: car, 8000: display device, 8001: housing, 8002: display portion, 8003: speaker portion, 8005: power storage device, 8100: lighting device, 8101: housing, 8102: light source, 8104: ceiling, 8105: power storage device, 8200: indoor unit, 8201: housing, 8202: air outlet, 8204: outdoor unit, 8205: power storage device, 8300: electric refrigerator-freezer, 8301: housing, 8302: refrigerator door, 8303: freezer door, 8305: power storage device, 8405: wall, 8406: floor, 8407: window

The invention claimed is:

1. A semiconductor device comprising:
a high frequency amplifier circuit;
an envelope detection circuit comprising a first transistor;
a comparator; and
a power supply circuit,
wherein the first transistor comprises a metal oxide in a channel formation region,
wherein a gate of the first transistor is electrically connected to one of a source and a drain of the first transistor,
wherein an output terminal of the high frequency amplifier circuit is electrically connected to an input terminal of the envelope detection circuit,
wherein an output terminal of the envelope detection circuit is electrically connected to a non-inverting input terminal of the comparator,
wherein an output terminal of the comparator is electrically connected to the power supply circuit,
wherein the power supply circuit is electrically connected to the high frequency amplifier circuit,
wherein the high frequency amplifier circuit, the comparator, and the power supply circuit each comprise a second transistor formed on a semiconductor substrate, and
wherein the first transistor is stacked over the semiconductor substrate.

2. A semiconductor device comprising:
a high frequency amplifier circuit;
an envelope detection circuit comprising a first transistor;
an adder circuit comprising an operational amplifier and a resistor; and
a power supply circuit, wherein the first transistor comprises a metal oxide in a channel formation region, wherein a gate of the first transistor is electrically connected to one of a source and a drain of the first transistor, wherein an output terminal of the high frequency amplifier circuit is electrically connected to an input terminal of the envelope detection circuit, wherein an output terminal of the envelope detection circuit is electrically connected to an input terminal of the adder circuit, wherein an output terminal of the adder circuit is electrically connected to the power supply circuit, wherein the adder circuit is configured to add an external supply potential to a potential of the output terminal of the envelope detection circuit, wherein the power supply circuit is electrically connected to the high frequency amplifier circuit, wherein the high frequency amplifier circuit, the adder circuit, and the power supply circuit each comprise a second transistor formed on a semiconductor substrate, and wherein the first transistor is stacked over the semiconductor substrate.

3. The semiconductor device according to claim 1, further comprising a smoothing circuit electrically connected to the output terminal of the comparator and the power supply circuit.

4. The semiconductor device according to claim 1, wherein the metal oxide comprises In, Ga, and Zn.

5. The semiconductor device according to claim 2, wherein the metal oxide comprises In, Ga, and Zn.

6. The semiconductor device according to claim 1, wherein the metal oxide comprises In.

7. The semiconductor device according to claim 2, wherein the metal oxide comprises In.

* * * * *